United States Patent
Kaida

Patent Number: 5,548,179
Date of Patent: Aug. 20, 1996

[54] CHIP-TYPE PIEZOELECTRIC RESONANCE COMPONENT

[75] Inventor: Hiroaki Kaida, Tonami, Japan

[73] Assignee: Murata Manufacturing Co., Ltd., Japan

[21] Appl. No.: 459,185

[22] Filed: Jun. 1, 1995

[30] Foreign Application Priority Data

Oct. 17, 1994 [JP] Japan ................................. 6-250409

[51] Int. Cl.⁶ ................................................... H01L 41/08
[52] U.S. Cl. ........................... 310/367; 310/348; 333/187
[58] Field of Search .................................. 310/321, 348, 310/367; 333/186, 187, 189, 190

[56] References Cited

U.S. PATENT DOCUMENTS

| | | | |
|---|---|---|---|
| 2,231,483 | 2/1941 | Smalts | 310/367 |
| 2,443,471 | 6/1948 | Mason | 178/44 |
| 3,185,943 | 5/1965 | Honda et al. | 333/72 |
| 3,411,023 | 12/1965 | Quate | 310/8 |
| 3,488,530 | 1/1970 | Staudte | 310/9.1 |
| 3,723,920 | 3/1973 | Sheahan et al. | 333/72 |
| 3,745,385 | 7/1973 | Nakajima | 310/9.5 |
| 4,101,795 | 7/1978 | Fukomoto et al. | 310/336 |

(List continued on next page.)

FOREIGN PATENT DOCUMENTS

| | | | |
|---|---|---|---|
| 0365268 | 4/1990 | European Pat. Off. | H03H 9/19 |
| 0496583 | 1/1992 | European Pat. Off. | H03H 9/19 |
| 2547458 | 2/1984 | France | 310/346 |
| 2939844 | 7/1980 | Germany | H03H 9/05 |
| 3220032 | 12/1982 | Germany | H03H 9/19 |
| 0049013 | 4/1980 | Japan | H03H 9/10 |
| 55-52621 | 4/1980 | Japan | 310/368 |
| 55-64414 | 5/1980 | Japan | 310/344 |
| 57-48818 | 3/1982 | Japan | 310/344 |
| 5791016 | 6/1982 | Japan | H03H 9/17 |
| 0137113 | 7/1985 | Japan | H03H 9/05 |
| 0154211 | 7/1986 | Japan | 333/187 R |
| 0187907 | 8/1988 | Japan | 333/187 |
| 0253711 | 10/1988 | Japan | H03H 9/58 |
| 63-260311 | 10/1988 | Japan | 310/367 |
| 0260310 | 10/1988 | Japan | 310/367 |
| 63-311810 | 12/1988 | Japan | 310/367 |
| 0180109 | 7/1989 | Japan | H03H 9/02 |
| 0079510 | 3/1990 | Japan | H03H 9/19 |

(List continued on next page.)

OTHER PUBLICATIONS

J. Ormondroyd & J. P. Hartog, "The Theory of the Dynamic Vibration Absorber", pp. 9–22, Transactions of the American Society of Mechanical Engineers, APM–50–7.

Mechanical Vibrations, J. P. Den Hartog, 1984, "3.2. The Undamped Dynamic Vibration Absorber.", pp. 87–93.

Vibration Engineering, Osamu Taniguchi, pp. 112–116, and English Translation.

Co–pending Patent Application No. 08/452,516.

Co–pending U.S. Patent Application No. 08/285,233.

Inoue, et al., "First and Second Order Group Timing tank Ceramic Filters for PCM Carriers Systems," Japanese Journal of Applied Physics, vol. 20 (1981) Supplemental 20–4, pp. 101–104.

Co–pending U.S. Patent Applications No. 08/227,279 allowed.

*Primary Examiner*—Thomas M. Dougherty
*Attorney, Agent, or Firm*—Ostrolenk Faber, Gerb & Soffen, LLP

[57] ABSTRACT

In a chip-type piezoelectric resonance component, a piezo-resonator (3) is fixed onto a base substrate (2) and a cap member (4) is fixed to the base substrate (2) to enclose the piezo-resonator (3). The piezo-resonator (3) is provided with upper and lower surfaces having shorter and longer sides of lengths a and b at a ratio which is set in the range of ±10% about a value satisfying the following equation:

$$b/a = n(-1.47\sigma + 1.88) \tag{1}$$

(n: integer)
assuming that σ represents the Poisson's ratio of a piezoelectric material.

19 Claims, 25 Drawing Sheets

U.S. PATENT DOCUMENTS

| | | | |
|---|---|---|---|
| 4,287,493 | 9/1981 | Masaie | 333/191 |
| 4,323,865 | 4/1982 | Tanaka | 333/187 |
| 4,348,609 | 9/1982 | Inoue | 310/367 |
| 4,350,918 | 9/1982 | Sato | 310/367 |
| 4,355,257 | 10/1982 | Kawashima | 310/361 |
| 4,356,421 | 10/1982 | Shimizu et al. | 310/320 |
| 4,360,754 | 11/1982 | Toyoshima et al. | 310/366 |
| 4,365,181 | 12/1982 | Yamamoto | 310/320 |
| 4,443,728 | 4/1984 | Kudo | 310/312 |
| 4,447,753 | 5/1984 | Ochiai | 310/312 |
| 4,454,444 | 6/1984 | Fujiwara et al. | 310/360 |
| 4,462,092 | 7/1984 | Kawabuchi et al. | 310/336 |
| 4,484,382 | 11/1984 | Kawashima | 29/25.35 |
| 4,511,202 | 4/1985 | Kasai | 333/189 |
| 4,555,682 | 11/1985 | Gounji et al. | 333/189 |
| 4,562,372 | 12/1985 | Nakamura et al. | 310/321 |
| 4,564,825 | 1/1986 | Takahashi et al. | 333/191 |
| 4,571,794 | 2/1986 | Nakamura | 29/25.35 |
| 4,609,844 | 9/1986 | Nakamura et al. | 310/321 |
| 4,757,581 | 7/1988 | Yamada et al. | 29/25.35 |
| 4,900,971 | 2/1990 | Kawashima | 310/361 |
| 5,001,383 | 3/1991 | Kawashima | 310/367 |
| 5,006,824 | 4/1991 | Paff | 333/197 |
| 5,059,853 | 10/1991 | Kawashima | 310/367 |
| 5,107,164 | 4/1992 | Kimura | 310/327 |
| 5,117,147 | 5/1992 | Yoshida | 310/320 |
| 5,118,980 | 6/1992 | Takahashi | 310/320 |
| 5,159,301 | 10/1992 | Kaida et al. | 333/187 |
| 5,192,925 | 3/1993 | Kaida | 333/187 |
| 5,218,260 | 6/1993 | Kawashima | 310/361 |
| 5,260,675 | 11/1993 | Ogawa | 333/189 |
| 5,274,297 | 12/1993 | Hermann et al. | 310/361 |
| 5,302,880 | 4/1994 | Kaida | 310/370 |
| 5,341,550 | 8/1984 | Kaida | 29/25.35 |
| 5,361,045 | 11/1994 | Beaussier et al. | 331/154 |
| 5,394,123 | 2/1995 | Inoue et al. | 333/189 |
| 5,422,532 | 6/1995 | Inoue et al. | 310/326 |
| 5,442,251 | 8/1995 | Kaida | 310/321 |

FOREIGN PATENT DOCUMENTS

| | | | |
|---|---|---|---|
| 0075213 | 3/1990 | Japan | 310/167 |
| 0279511 | 3/1990 | Japan | 310/367 |
| 0226106 | 10/1991 | Japan | 333/187 |
| 4192909 | 7/1992 | Japan | H03H 9/19 |
| 5075372 | 3/1993 | Japan | |
| 6164307 | 6/1994 | Japan | H03H 9/58 |
| 1358596 | 6/1970 | United Kingdom | H03H 9/14 |
| 2004434 | 3/1979 | United Kingdom | H03H 9/26 |
| 2043995 | 10/1979 | United Kingdom | H03H 9/19 |
| 2102199 | 5/1982 | United Kingdom | H03H 9/05 |
| 2117968 | 3/1983 | United Kingdom | H03H 9/19 |
| 2213013 | 8/1989 | United Kingdom | H03H 9/10 |
| 2277228 | 10/1994 | United Kingdom | H04R 17/10 |
| 9216997 | 10/1992 | WIPO | H03H 9/58 |

205

CHIP-TYPE PIEZOELECTRIC RESONANCE COMPONENT

BACKGROUND OF THE INVENTION

1. Field of the Invention

The present invention relates to a chip-type piezoelectric resonance component which is suitably surface-mounted on a substrate, for example, and more particularly, it relates to a chip-type piezoelectric resonance component employing an energy-trap piezo-resonator.

2. Description of the Background Art

In general, a resonator utilizing an expansion vibration mode of an angular piezoelectric plate, that utilizing a length vibration mode of a bar type piezoelectric body, or a piezoelectric tuning fork type resonator is employed as a piezo-resonator for the kHz band.

In such a piezo-resonator, a resonance part vibrates upon application of a voltage. In order to form the piezo-resonator as an actual component, therefore, it is necessary to support the piezo-resonator for allowing resonance. It is possible to mechanically hold an energy-trap piezo-resonator in regions other than its resonance part since vibrational energy is trapped in the resonance part. In view of application to a product, therefore, the energy-trap piezo-resonator is superior to other types of piezo-resonators, and hence such an energy-trap resonator is desired also in relation to a piezo-resonator for the kHz band.

In a resonator utilizing an expansion vibration mode or that utilizing a length vibration mode which is known as a general kHz band piezo-resonator, however, it is impossible to trap vibrational energy. As shown in FIG. 1, therefore, a piezo-resonator 191 utilizing a length vibration mode is held by spring terminals 192 and 193 holding vibration nodal points therebetween. Also in an angular plate type piezo-resonator utilizing an expansion vibration mode which cannot trap energy, nodal points of the resonator are held between spring terminals. In the piezo-resonators for the kHz band utilizing the expansion and length vibration modes, therefore, the structures of the components are so complicated that it is extremely difficult to form miniature chip-type components which are surface-mountable.

In a piezoelectric tuning fork type resonator 196 comprising a piezoelectric plate 194 which is polarized along its thickness and provided with slits 194a to 194c, and vibrating electrodes 195a (that on a back surface side is not shown) which are formed on both major surfaces of the piezoelectric plate 194 around the central slit 194b as shown in FIG. 2, on the other hand, energy is trapped in its vibrating part. Therefore, the resonator 196 can be formed as a surface-mountable chip component since its characteristics remain unchanged when this resonator 196 is held in portions close to edges 194d and 194e of the piezoelectric plate 194, for example.

In the piezoelectric tuning fork type resonator 196, however, the ensurable bandwidth is merely about 2% of the resonance frequency due to restriction on its mode, although the energy can be trapped. In the market, on the other hand, a broadband piezo-resonator is strongly required also in relation to the kHz band. The piezoelectric tuning fork type resonator 196 cannot satisfy such requirement.

SUMMARY OF THE INVENTION

An object of the present invention is to provide an energy-trap chip-type piezoelectric resonance component which can be employed in the kHz band with broader band characteristics.

In order to attain the aforementioned object, the present invention provides a chip-type piezoelectric resonance component comprising a base substrate, a piezo-resonator which is directly or indirectly fixed onto the base substrate and provided with a piezoelectric resonance part having a rectangular sectional shape with pairs of shorter and longer sides at a ratio which is set in the range of ±10% about a value satisfying the following equation:

$$b/a = n(-1.47\sigma + 1.88) \tag{1}$$

(n: integer)

assuming that a and b represent the lengths of the shorter and longer sides respectively and σ represents the Poisson's ratio of the material forming the piezo-resonator, and a cap member which is fixed to the base substrate to enclose the piezo-resonator fixed onto the base substrate.

Namely, the present invention is directed to a chip-type piezoelectric resonance component employing a piezo-resonator having a piezoelectric resonance part which is so formed that the ratio b/a is in the aforementioned specific range, as clearly understood from later description of embodiments. The piezo-resonator provided with a piezoelectric resonance part having the ratio b/a which is in the aforementioned specific range resonates in a width expansion mode as described later, and vibration nodal points are located on substantially central portions of shorter side surfaces and centers of rectangular surfaces. When the piezo-resonator is mechanically supported at any of the nodal points, therefore, vibrational energy can be effectively trapped in the piezoelectric resonance part. Therefore, the piezo-resonator can be employed as an energy-trap piezo-resonator. In the chip-type piezoelectric resonance component according to the present invention, therefore, vibrational energy is effectively trapped in the piezoelectric resonance part of the piezo-resonator, whereby the piezo-resonator can be readily fixed to the base substrate while allowing vibration of the piezoelectric resonance part. Thus, the aforementioned chip-type piezoelectric resonance component can be readily formed by combining the piezo-resonator with the base substrate and the cap member.

In the present invention, the aforementioned piezo-resonator can be formed to have a proper shape so far as the same is provided with a piezoelectric resonance part having a ratio b/a which is set in the aforementioned range. Namely, the piezo-resonator may be formed only by the piezoelectric resonance part, or support parts may be coupled to substantially central portions of shorter side surfaces of the piezo-resonator. Alternatively, the support parts may be coupled to centers of both shorter side surfaces of the piezoelectric resonance part.

Further, resonance electrodes may be formed in any positions of the piezoelectric resonance part so far as width expansion mode vibration can be excited, as clearly understood from the later description of the embodiments. For example, the resonance electrodes may be formed on both rectangular major surfaces forming the piezoelectric resonance part. When the piezoelectric resonance part is provided in the form of a rectangular plate which is polarized in parallel with rectangular surfaces, on the other hand, a pair of resonance electrodes may be formed on one major surface, or on both major surfaces, to be opposed to each other at a prescribed distance.

The piezoelectric resonance part can be made of a proper piezoelectric material such as piezoelectric ceramics, crystal or a piezoelectric single crystal. Alternatively, the piezoelectric resonance part may be made of a composite material. Namely, the piezoelectric resonance part may be formed by stacking a piezoelectric thin film on a metal plate or a semiconductor plate. As to the Poisson's ratio G appearing in the above equation (1), it is necessary to take the effective Poisson's ratio of the overall composite material into consideration when the piezoelectric resonance part is made of the composite material.

The base substrate can be made of a material, such as a ceramic plate or a synthetic resin plate, having strength which is suitable for forming a chip-type component. Preferably, at least one terminal electrode is formed on the base substrate. Namely, a chip-type piezoelectric resonance component which is surface-mountable on a printed circuit board or the like can be structured by forming the terminal electrode.

In the chip-type piezoelectric resonance component according to the present invention, the piezoelectric resonance part of the piezo-resonator is preferably fixed to the base substrate through a gap of a prescribed thickness. Therefore, the chip-type piezoelectric resonance component preferably further comprises gap forming means for forming this gap.

The gap forming means can be prepared from an adhesive for fixing the piezo-resonator to the base substrate, for example. Namely, it is possible to define the gap by the adhesive, by controlling its thickness to be capable of defining the gap. In a structure having a terminal electrode which is provided on the base substrate, alternatively, the piezo-resonator may be fixed to the base substrate through a conductive adhesive so that the piezo-resonator is electrically connected with the terminal electrode provided on the base substrate.

Further, the chip-type piezoelectric resonance component may comprise a metal terminal for electrically connecting the terminal electrode which is formed on the base substrate with the piezo-resonator, and in this case, the gap forming means may be defined by the metal terminal. Namely, the length of the metal terminal may be so selected that a gap of a prescribed thickness can be defined between the piezoelectric resonance part of the piezo-resonator and the base substrate.

According to the present invention, at least one piezo-resonator may be further stacked in addition to the piezo-resonator which is fixed onto the base substrate. In this case, a filter circuit can be formed by a plurality of piezo-resonators, thereby providing a chip-type piezoelectric filter.

In the present invention, the piezo-resonator may be directly or indirectly fixed onto the base substrate through solder or a conductive adhesive, or by welding such as resistance welding. The term "indirectly" means that the piezo-resonator is fixed to the base substrate through another member such as another piezo-resonator or a dielectric substrate, for example. Thus, according to the present invention, the piezo-resonator utilizing a width expansion mode can be directly fixed onto the base substrate, or indirectly fixed thereto through another member.

The chip-type piezoelectric resonance component according to the present invention employs the energy-trap piezo-resonator provided with the piezoelectric resonance part utilizing a width expansion mode having the ratio b/a which is set in the aforementioned specific range. In this piezo-resonator, vibrational energy is effectively trapped in the piezoelectric resonance part while vibration nodal points are located on centers of major surfaces of the piezoelectric resonance part and substantially central portions of the shorter side surfaces, whereby the vibrational energy is reliably trapped in the piezoelectric resonance part when the piezo-resonator is mechanically supported at any of these portions.

Therefore, it is possible to fix the piezo-resonator to the base substrate through support parts which are coupled to the vibration nodal points. Alternatively, a piezo-resonator which is formed by only a piezoelectric resonance part can be fixed to the base substrate through the aforementioned vibration nodal points. In either case, the piezo-resonator can be fixed to the base substrate while allowing vibration of the piezoelectric resonance part. Thus, it is possible to form an energy-trap chip-type piezoelectric resonance component by fixing the cap member to the base substrate to enclose the piezo-resonator.

Therefore, it is possible to implement broader band characteristics as compared with a conventional chip-type piezoelectric resonance component, thereby providing a chip-type piezoelectric resonance component which can be effectively employed in the kHz band, in particular.

When support parts are coupled to the piezoelectric resonance part, the piezo-resonator can be fixed to the base substrate through the support parts, whereby the support parts can be selected in dimensions required for the fixation. Thus, it is possible to provide an energy-trap chip-type piezoelectric resonance component which is excellent in mechanical strength while allowing vibration of the piezoelectric resonance component.

Preferably, the aforementioned gap forming means is so provided as to facilitate vibration of the piezoelectric resonance part, whereby a chip-type piezoelectric resonance component having further stable characteristics can be provided.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 11 illustrates the relation between Poisson's ratios σ and ratios b/a:

DESCRIPTION OF THE PREFERRED EMBODIMENTS

Non-restrictive embodiments of the present invention are now described.

First, description is made on a piezo-resonator utilizing a width expansion mode which is employed in the present invention.

Figure 3:
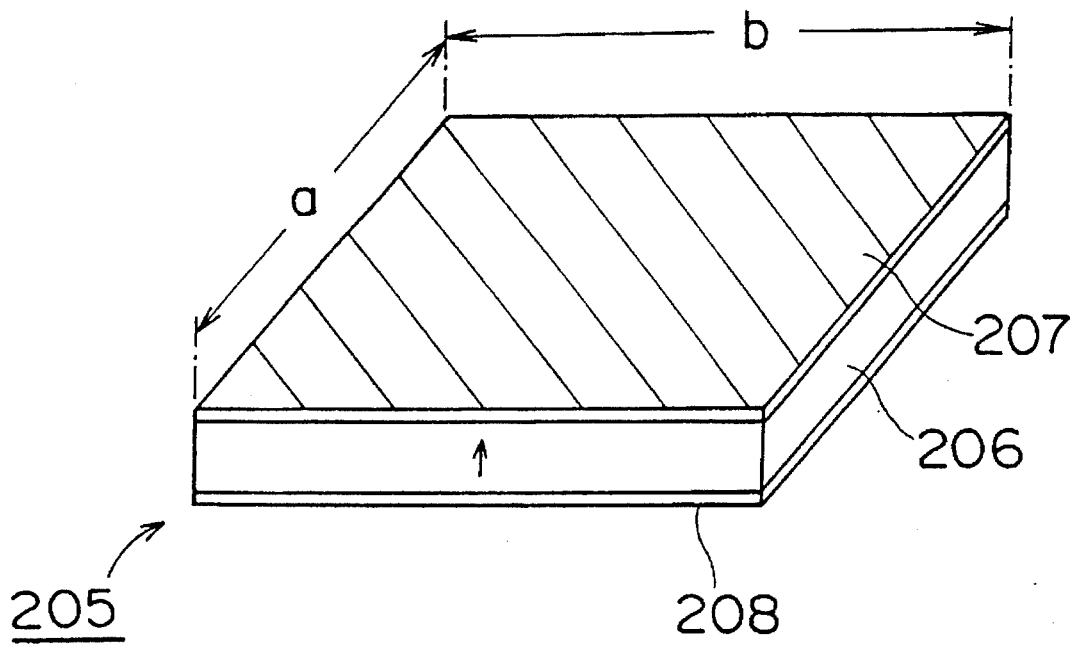
FIG. 3 is a perspective view showing a piezo-resonator utilizing a width expansion mode.

FIG. 3 is a perspective view for illustrating a piezoelectric vibrating part in an energy-trap piezo-resonator 205 which is employed in the present invention. In the piezo-resonator 205, electrodes 207 and 208 are formed on both major surfaces of a rectangular piezoelectric ceramic plate 206 which is so polarized that polarization axes are regularized along its thickness. Assuming that a and b represent lengths of shorter and longer sides of the piezoelectric ceramic plate 206 respectively, the ratio b/a is selected in the aforementioned specific range, thereby strongly exciting width expansion mode vibration as described later. Description is now made on that width expansion mode vibration is strongly excited when the ratio b/a is set in the aforementioned specific range.

Figure 4:
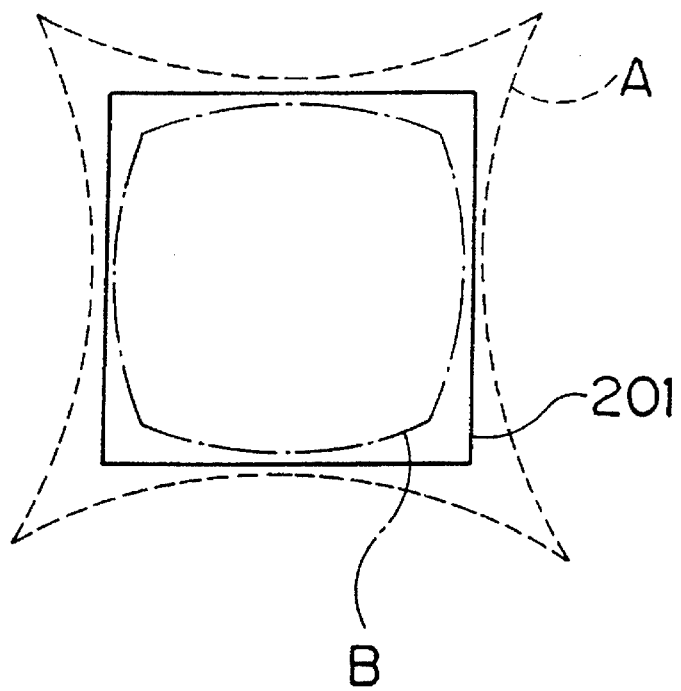
FIG. 4 is a typical plan view for illustrating an expansion mode of a square plate.
Figure 5:
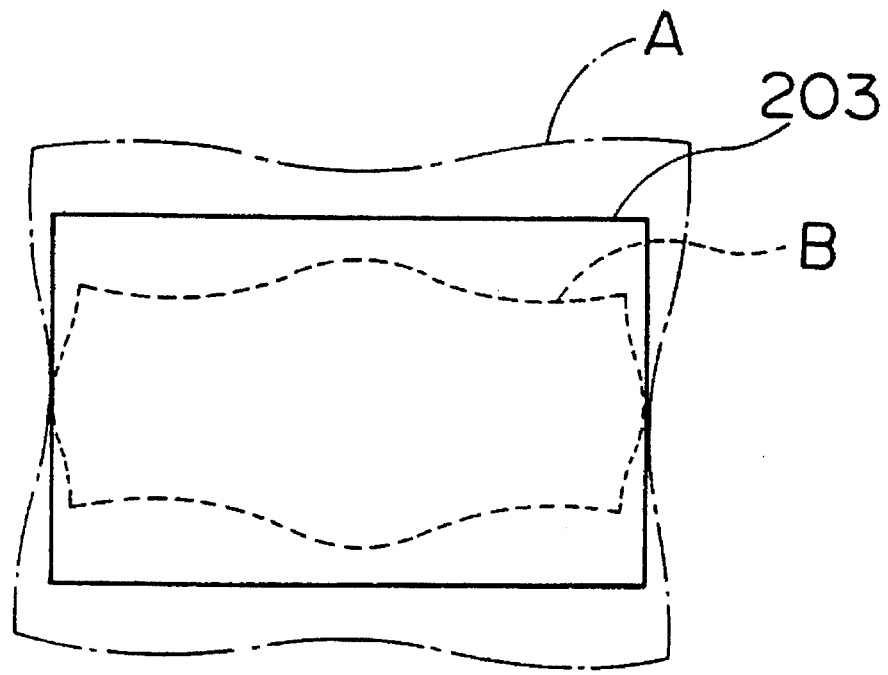
FIG. 5 is a typical plan view for illustrating a width expansion mode.
Figure 6:
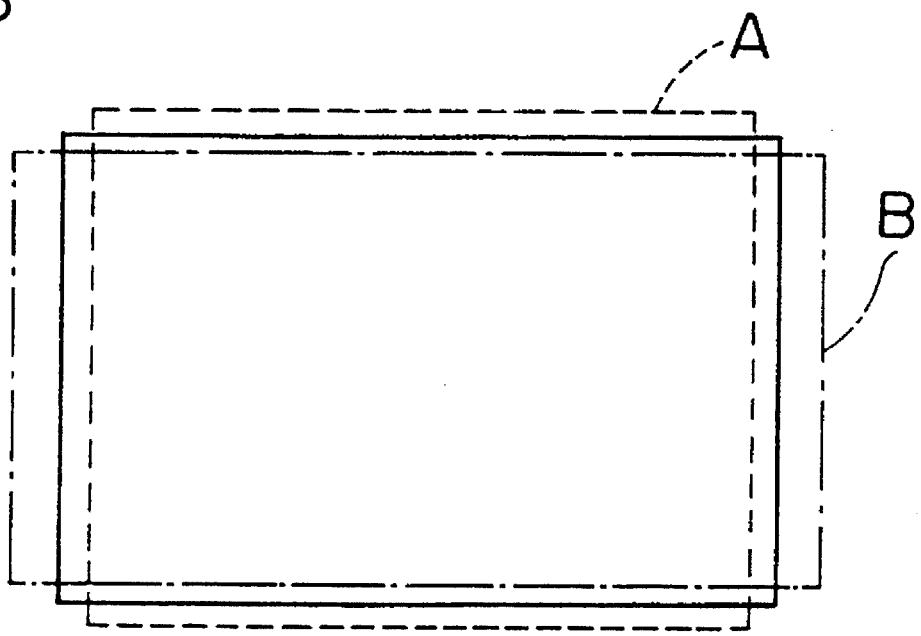
FIG. 6 is a typical plan view for illustrating a width mode.

FIGS. 4 to 6 are schematic plan views showing vibrating states of vibrators for illustrating an expansion mode, a width expansion mode and a width mode respectively. The inventor has analyzed vibrating states of rectangular plate type vibrators with various lengths of shorter and longer sides by a finite element method. When the ratio b/a of the length b of the longer sides to the length a of the shorter sides is 1, i.e., when a vibrator 201 is in the form of a square plate, expansion mode vibration is strongly excited as shown in FIG. 4. Namely, vibration is repeated between states shown by broken lines A and one-dot chain lines B in the vibrator 201 having a square plane shape as shown in FIG. 4, whereby expansion mode vibration is strongly excited.

When the ratio b/a is rendered considerably larger than 1, i.e., when b/a>>1, a rectangular vibrator vibrates between states shown by broken lines A and one-dot chain lines B as shown in FIG. 6, whereby width mode vibration is strongly excited.

When the ratio b/a is larger than 1 and smaller than a value strongly exciting the aforementioned width mode vibration, on the other hand, vibration between states shown by one-dot chain lines A and broken lines B, i.e., width expansion mode vibration is strongly excited, as shown in FIG. 5 in relation to a vibrator 203.

The "width expansion mode" has been thus named since the same is conceivably an intermediate vibration mode between the well-known expansion and width modes.

On the basis of the aforementioned recognition, samples of the piezo-resonator 205 shown in FIG. 3 were prepared by piezoelectric ceramic plates having ratios b/a which were selected in specific values.

Figure 7A:
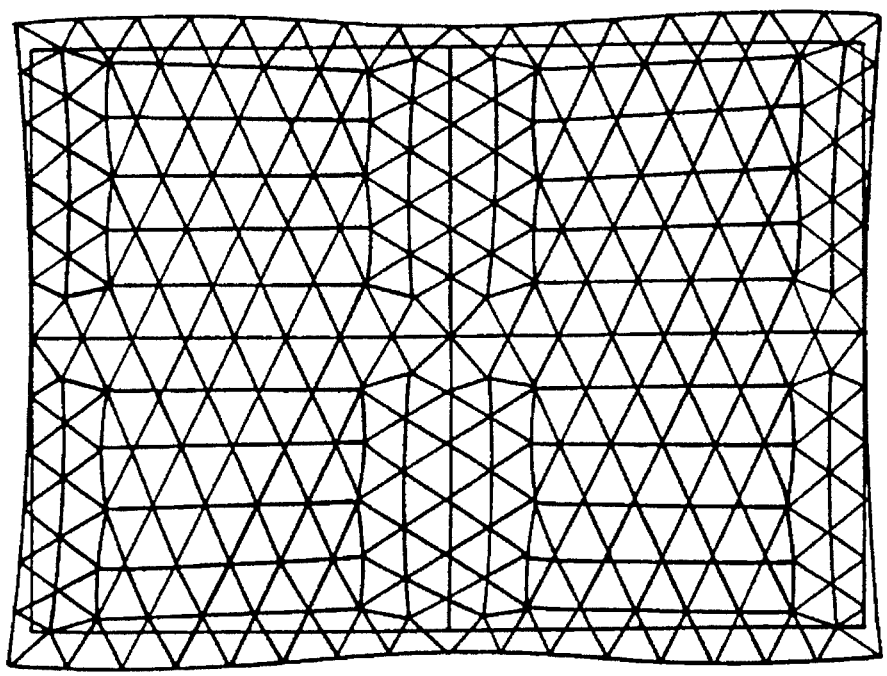
FIGS. 7A and 7B are a typical plan view showing a state of displacement distribution upon excitation of width expansion mode vibration analyzed by a finite element method and a diagram for illustrating the coordinate system in FIG. 7A respectively.

The aforementioned width expansion mode vibration was excited in the samples of the aforementioned piezo-resonator 205 at various ratios b/a, whereby it has been confirmed that vibration of the aforementioned width expansion mode is most strongly excited when the ratio b/a satisfies the equation b/a=−1.47σ+1.88. FIG. 7A shows the result of displacement distribution in this sample of the piezo-resonator 205 which was analyzed by a finite element method.

Figure 7B:
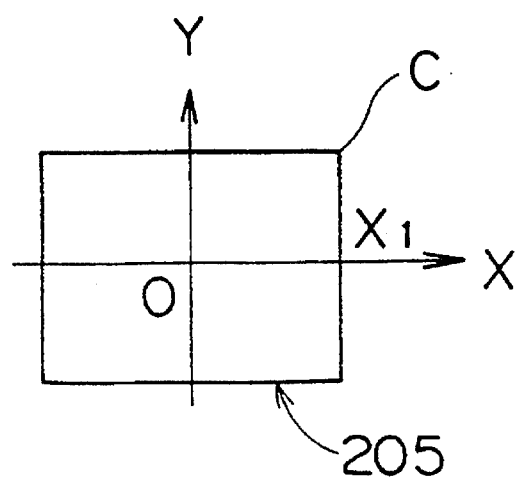
Figure 8:
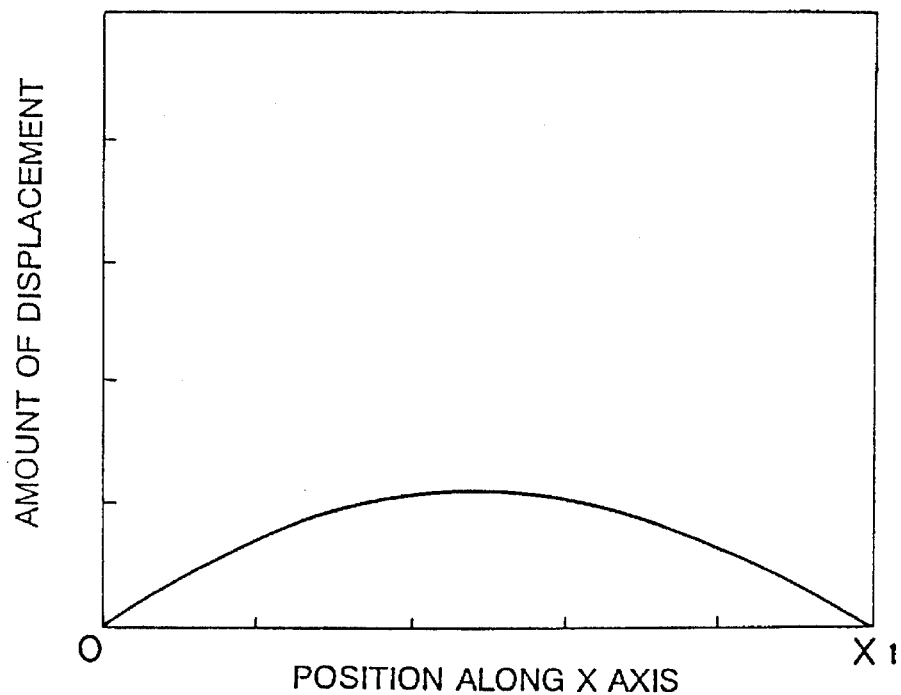
FIG. 8 illustrates the relation between positions along the X-axis in FIG. 7A and amounts of displacement.

In the displacement distribution which was analyzed by the finite element method, states of displacement of the respective portions were measured while defining X and Y axes as shown in FIG. 7B with reference to the center 0 of either major surface of the piezo-resonator 205, whereby a result shown in FIG. 8 was obtained. It is understood that the amount of displacement is minimized at the center 0 and a position $X_1$ in FIG. 7B, i.e., the center of either shorter side, and maximized at an intermediate portion therebetween in the piezo-resonator 205 exciting vibration of the aforementioned width expansion mode vibration along the X axis. This means that nodal points are located at the centers of the major surfaces and those of the shorter sides in the piezo-resonator 205 utilizing a width expansion mode. Thus, it is understood possible to support the piezo-resonator 205 while allowing vibration of the aforementioned width expansion mode by supporting the centers of the major surfaces or those of the shorter sides by other support members.

Figure 9:
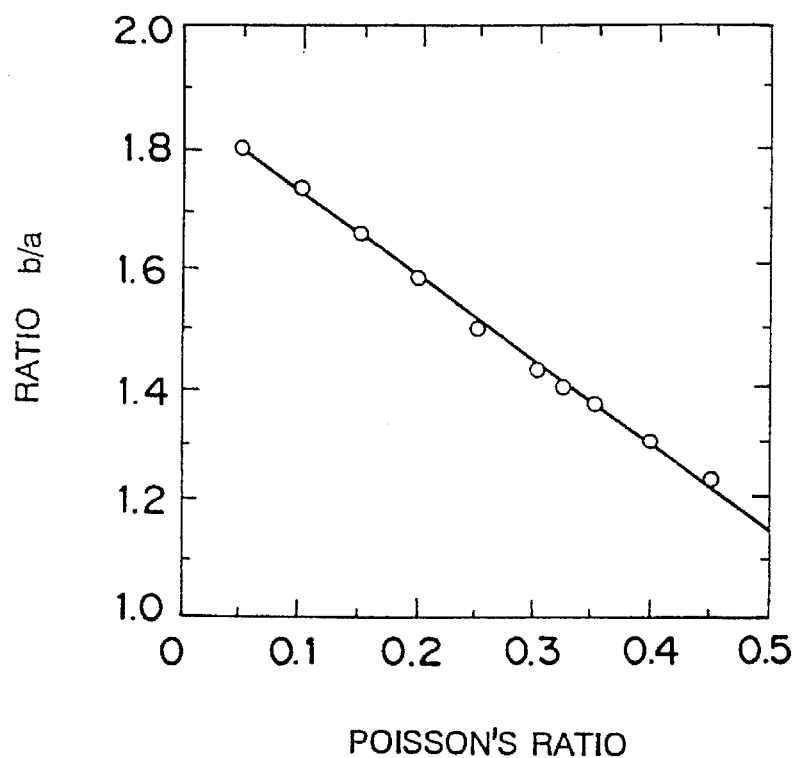
FIG. 9 illustrates the relation between ratios b/a and Poisson's ratios σ.

Further, it has been confirmed that the aforementioned ratio b/a is related to the Poisson's ratio of the piezo-resonator 205. Ratios b/a exciting vibration of the aforementioned width expansion mode were measured in relation to vibrators of various Poisson's ratios and the values of the ratios b/a were plotted, to obtain results shown in FIG. 9. As shown in the straight line of FIG. 9, therefore, it has been recognized possible to reliably excite vibration of the width expansion mode by selecting the ratio b/a to satisfy the following equation:

$$b/a=-1.47\sigma+1.88 \qquad (2)$$

Figure 10:
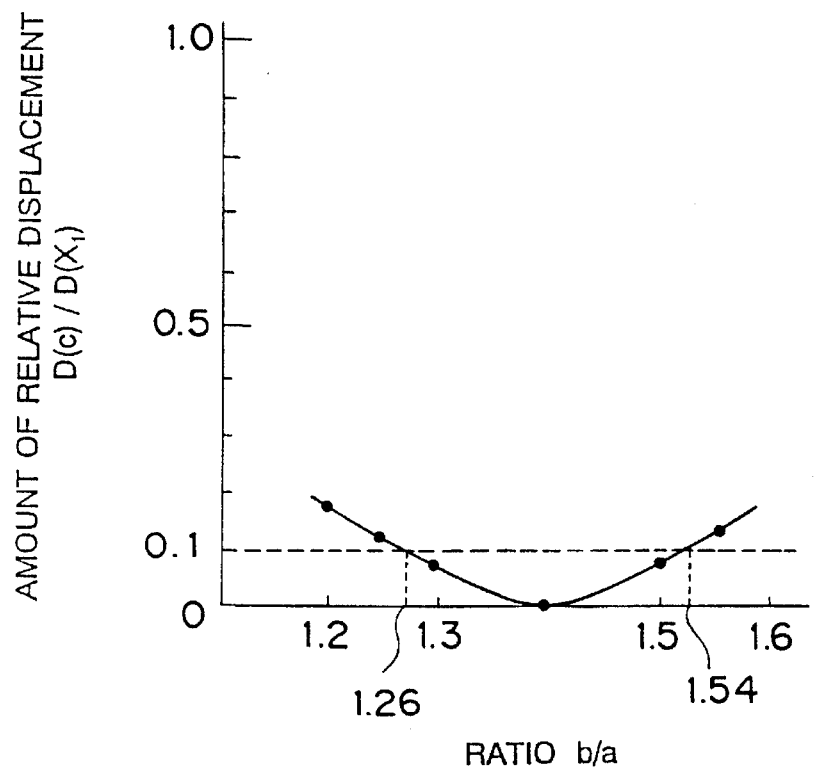
FIG. 10 illustrates the relation between ratios b/a and amounts D of relative displacement.

Further, it has been recognized that the width expansion mode vibration is strongly excited not only when the ratio b/a satisfies the equation (2) but when the former slightly deviates from the latter, and hence presence/absence of excitation of the width expansion mode vibration was confirmed through samples of a piezoelectric ceramic plate having a Poisson's ratio σ of 0.324 while varying the ratios b/a. Namely, amounts $D(X_1)/D(C)$ of relative displacement of points $X_1$ with respect to points C were measured assuming that $D(X_1)$ represents the amounts of displacement of the points $X_1$ in FIG. 7B and D(C) represents the amounts of displacement maximized at the points C (see FIG. 7) in the width expansion mode vibration. FIG. 10 shows the results.

It is clearly understood from FIG. 10 that relative displacement is within ±10% in relation to the Poisson's ratio σ of 0.324, when the ratio b/a is within the range of 1.26 to 1.54. Therefore, a plurality of types of samples of the piezo-resonator 205 shown in FIG. 3 were prepared so that the ratios b/a were within ±10% about the optimum value, and support members were coupled to central portions of shorter sides thereof for measuring resonance characteristics. Consequently, it has been confirmed that width expansion mode vibration is excellently trapped when the relative displacement is within ±10%, as hereinabove described.

Figure 11:
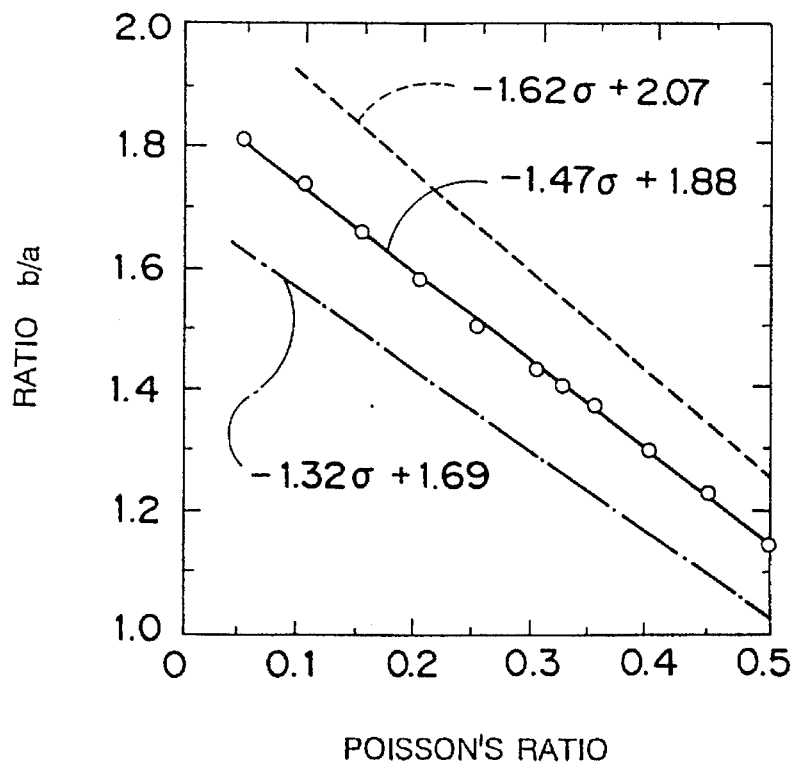

As shown in FIG. 11, therefore, it is understood that the aforementioned width expansion mode vibration can be excellently excited when the ratio b/a is set in the range of ±10% about a value satisfying the equation (2). It has also been recognized that the aforementioned width expansion mode vibration is excellently excited also when the ratio b/a is n times (−1.47σ+1.88) (n: integer).

Figure 12A:
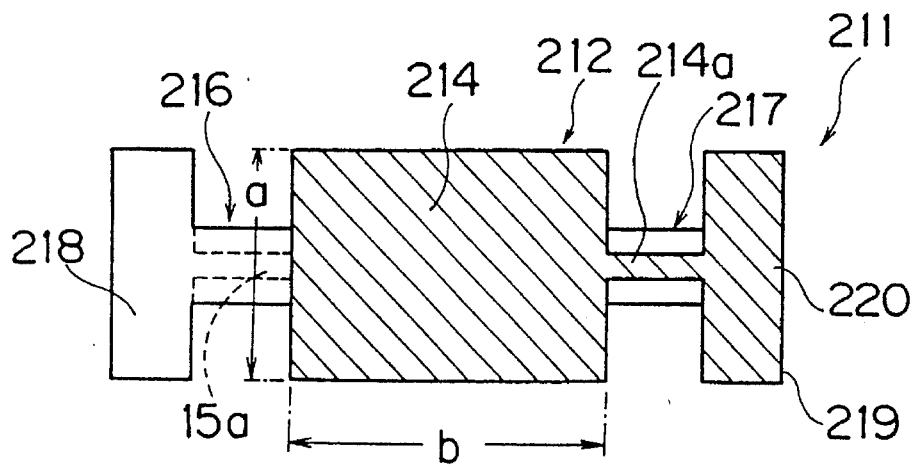
FIGS. 12A and 12B are a plan view and a side elevational view showing an exemplary piezo-resonator utilizing a width expansion mode.
Figure 12B:
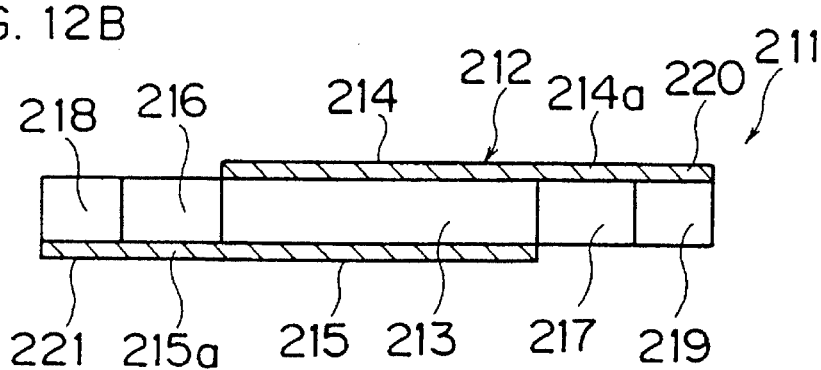

FIGS. 12A and 12B are a plan view and a front elevational view showing an exemplary piezo-resonator 211 utilizing a width expansion mode which is prepared on the basis of the aforementioned recognition, i.e., a first type piezo-resonator. The piezo-resonator 211 has a piezoelectric vibrating part 212 serving as a rectangular plate type vibrator. The piezoelectric vibrating part 212 has a rectangular plane shape, and comprises a piezoelectric ceramic plate 213 which is uniformly polarized along its thickness and resonance electrodes 214 and 215 which are formed on overall both major surfaces of the piezoelectric ceramic plate 213. Further, support members 216 and 217 are coupled to centers of shorter sides of the piezoelectric vibrating part 212, which are nodal points upon excitation in a width expansion vibration mode. In addition, holding parts 218 and 219 are coupled to outer end portions of the support members 216 and 217 respectively.

The support members 216 and 217 and the holding parts 218 and 219 are integrally formed with the piezoelectric ceramic plate 213. Namely, these elements are formed by preparing the rectangular piezoelectric ceramic plate 213 and machining the same to have the shape shown in FIG. 12A. Alternatively, the support members 216 and 217 and the holding parts 218 and 219 may be formed by members which are independent of the piezoelectric vibrating part 212, to be coupled thereto as shown in FIG. 12A by a proper method such as adhesion.

The aforementioned resonance electrodes 214 and 215 are electrically connected to lead electrodes 220 and 221 which are formed on first major surfaces of the holding parts 218 and 219 respectively, by lead conductive parts 214a and 215a which are formed on first surfaces of the support members 216 and 217.

When an alternating voltage is applied across the lead electrodes 220 and 221 in the piezo-resonator 211, the piezoelectric vibrating part 212 is excited in a width expansion mode. In this case, the central portions of the shorter sides of the piezoelectric vibrating part 212 hardly vibrate and form vibration nodal points, whereby the width expansion mode vibration is hardly inhibited despite the connection with the support members 216 and 217. Therefore, the vibration based on the aforementioned width expansion mode can be effectively trapped between the support members 216 and 217.

The resonance frequency is 800 kHz when the piezoelectric vibrating part 212 which is formed by the piezoelectric ceramic plate 213 is 2.5 mm in width and 3.5 mm in length, while the former is 2 KHz when the latter is 1.0 mm in width and 1.4 mm in length, whereby it is understood possible to form an energy-trap piezo-resonator which is suitably employed in the band of 800 kHz to 2 MHz.

As to the aforementioned resonance frequency, the effective frequency band is naturally varied when the piezoelectric vibrating part 212 is made of another material. Therefore, it is possible to obtain energy-trap piezo-resonators 211 which are suitably employed in various frequency bands by preparing piezoelectric vibrating parts 212 from various piezoelectric materials.

Figure 13:
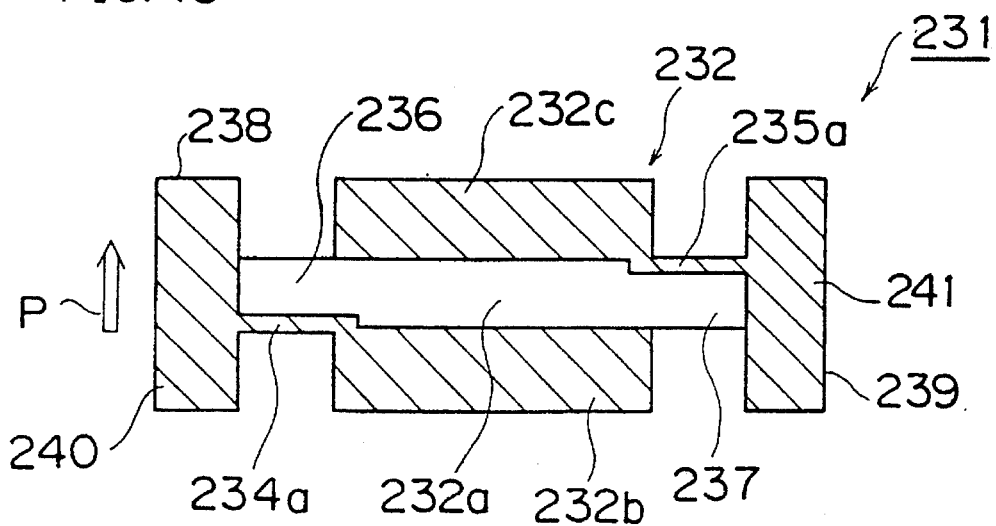
FIG. 13 is a plan view showing another exemplary piezo-resonator utilizing a width expansion mode.

FIG. 13 shows another exemplary energy-trap piezo-resonator 231 utilizing a width expansion mode. The piezo-resonator 231 has a piezoelectric vibrating part 232 serving as a rectangular plate type vibrator. In the piezoelectric vibrating part 232, a pair of resonance electrodes 232b and 232c are formed on an upper surface of a piezoelectric plate 232a, to be along longer side edges. The piezoelectric plate 232a is polarized along arrow P in FIG. 13, i.e., in a direction from the resonance electrode 232b toward the resonance electrode 232c. Also in this example, the ratio b/a of the length b of the longer sides to the length a of the shorter sides of the piezoelectric vibrating part 232 is set in the range of ±10% about a point satisfying the equation (1).

When an alternating voltage is applied across the resonance electrodes 232b and 232c, therefore, the piezoelectric vibrating part 232 vibrates in a width expansion mode. In this case, the direction of displacement of the piezoelectric vibrating part 232 is parallel to the applied electric field, whereby the piezo-resonator 231 utilizes a piezoelectric longitudinal effect.

Also in the piezo-resonator 231 of this example, support members 236 and 237 are coupled to vibration nodal points of the piezoelectric vibrating part 232 which resonates in the aforementioned width expansion mode, while holding parts 238 and 239 are coupled to outer end portions of the support members 236 and 237 respectively. Referring to FIG. 13, numerals 234a and 235a denote lead conductive parts, and numerals 240 and 241 denote lead electrodes.

As clearly understood from the example shown in FIG. 13, the resonator utilizing a width expansion mode according to the present invention is applicable not only to that utilizing a piezoelectric transverse effect, but to that utilizing a piezoelectric longitudinal effect.

Figure 14:
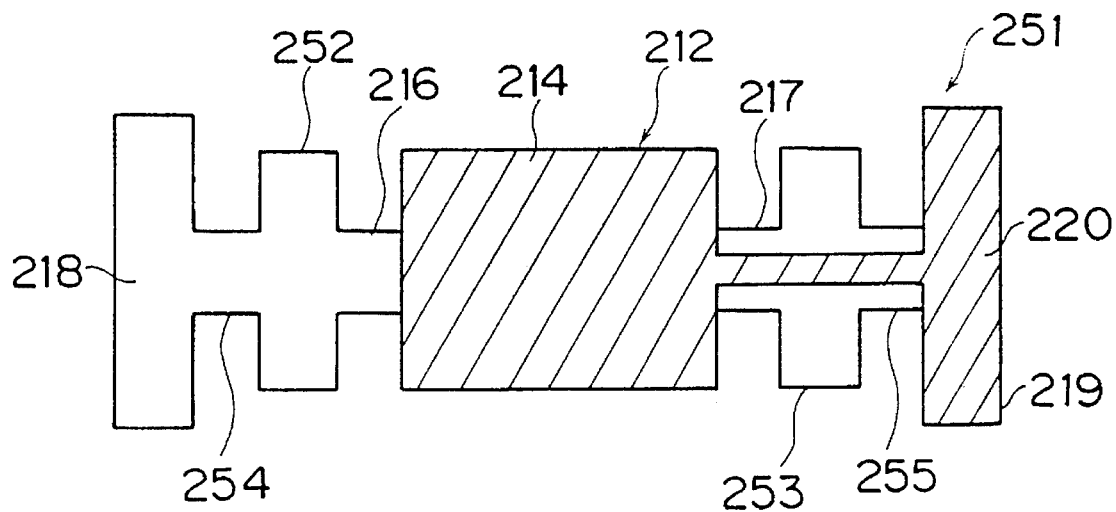
FIG. 14 is a plan view showing still another exemplary piezo-resonator utilizing a width expansion mode.

FIG. 14 is a plan view showing still another exemplary energy-trap piezo-resonator 251 utilizing a width expansion mode which is employed in the present invention. The piezo-resonator 251 shown in FIG. 14 is characterized in provision of dynamic dampers 252 and 253 and coupling parts 254 and 255, while other points are similar to those of the energy-trap piezo-resonator 211 shown in FIG. 12. Therefore, identical portions are denoted by the same reference numerals, to omit redundant description.

The dynamic dampers 252 and 253, which are coupled to outer ends of support members 216 and 217, are formed as vertically extending bar type portions. The coupling parts 254 and 255 are formed between outer sides of the dynamic dampers 252 and 253 and holding parts 218 and 219 respectively.

The support members 216 and 217 are coupled to vibration modal points of a piezoelectric resonance part 212, whereby leakage of vibration toward the support members 216 and 217 is extremely small. In this example, however, the dynamic dampers 252 and 253 resonate by slightly leaking vibration, thereby suppressing the slightly leaking vibration. Therefore, vibrational energy can be effectively trapped in portions up to the dynamic dampers 252 and 253. Thus, it is possible to form a further miniaturized piezo-resonator.

The present invention is directed to a chip-type piezoelectric resonance component employing an energy-trap piezo-resonator utilizing the aforementioned width expansion mode. Embodiments of such a chip-type piezoelectric resonance component are now described with reference to FIGS. 15 to 32.

First Embodiment

Figure 15:
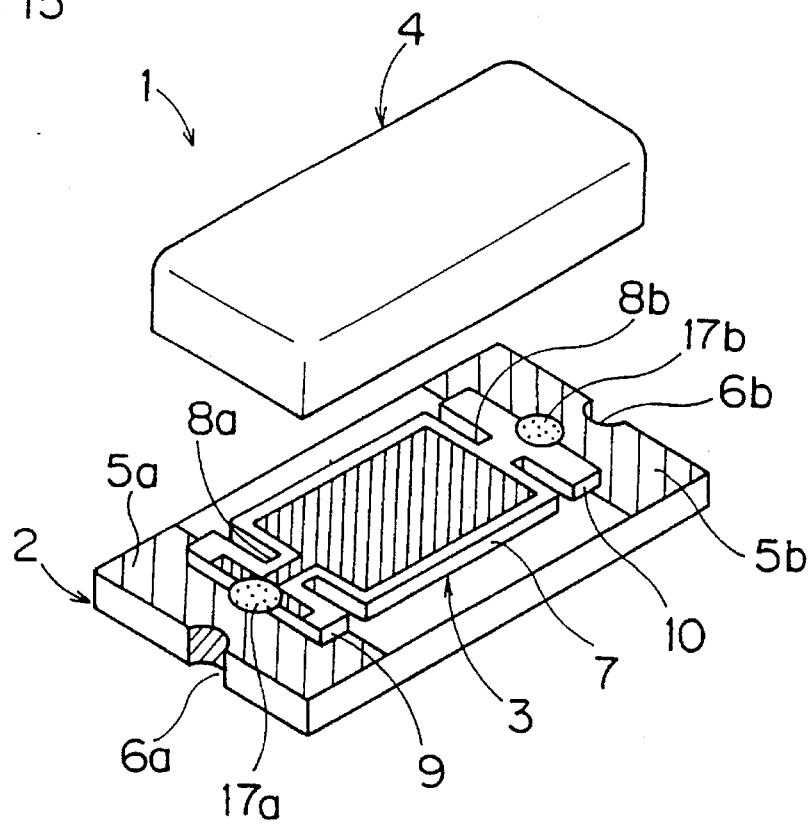
FIG. 15 is an exploded perspective view showing a chip-type piezoelectric resonance component according to a first embodiment of the present invention.

FIG. 15 is an exploded perspective view showing a chip-type piezoelectric resonance component 1 according to a first embodiment of the present invention. The chip-type piezoelectric resonance component 1 according to this embodiment comprises a base substrate 2, a piezo-resonator 3 which is fixed onto the base substrate 2, and a cap member 4 which is fixed to the base substrate 2 to enclose the piezo-resonator 3.

The base substrate 2, which is formed by an insulating ceramic plate of alumina or the like or a synthetic resin plate, has a rectangular plate shape as shown in FIG. 15. Terminal electrodes 5a and 5b are formed on an upper surface of the base substrate 2, to be along shorter side edges thereof. Further, notches 6a and 6b are formed in centers of shorter side surfaces of the base substrate 2, so that the terminal electrodes 5a and 5b reach inner peripheral surfaces of these notches 6a and 6b respectively. The terminal electrodes 5a and 5b are formed to also reach a lower surface (not shown) of the base substrate 2. Alternatively, the terminal electrodes 5a and 5b may not reach the lower surface of the base substrate 2.

The piezo-resonator 3 has a rectangular plate type piezoelectric resonance part 7, and support parts 9 and 10 which are coupled to the piezoelectric resonance part 7 through coupling parts 8a and 8b respectively. This piezo-resonator 3 is now described in detail with reference to FIGS. 16A and 16B.

Figure 16A:
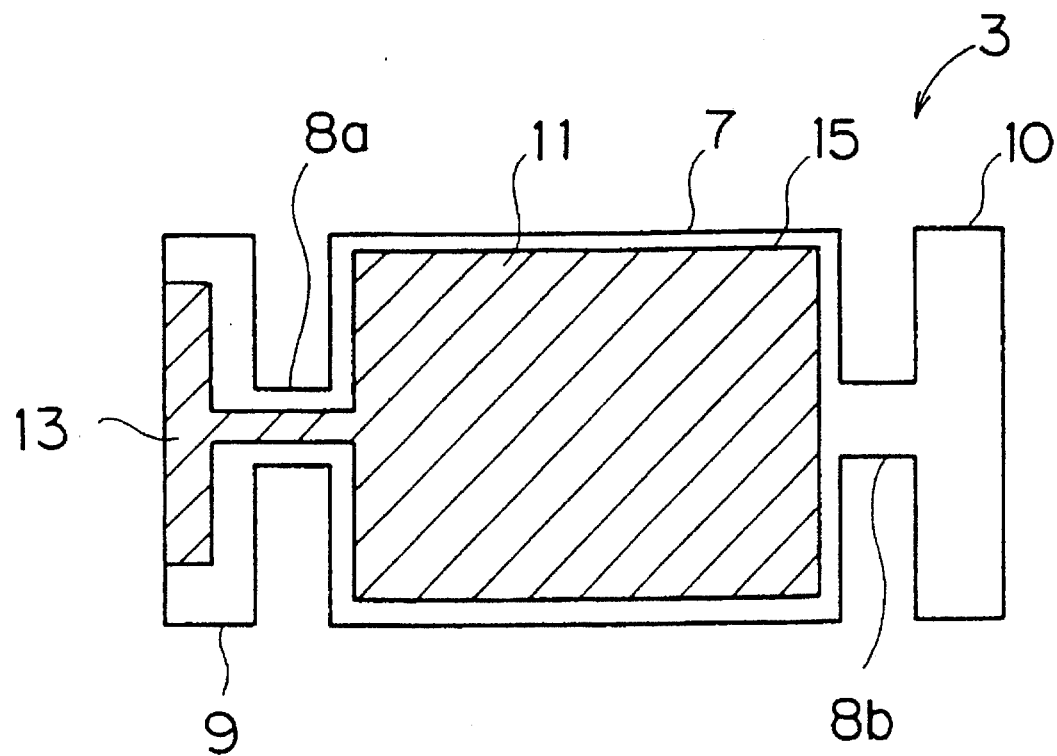
FIGS. 16A and 16B are a plan view showing a piezo-resonator which is employed in the first embodiment and a typical plan view showing a lower electrode shape through a piezoelectric plate.
Figure 16B:
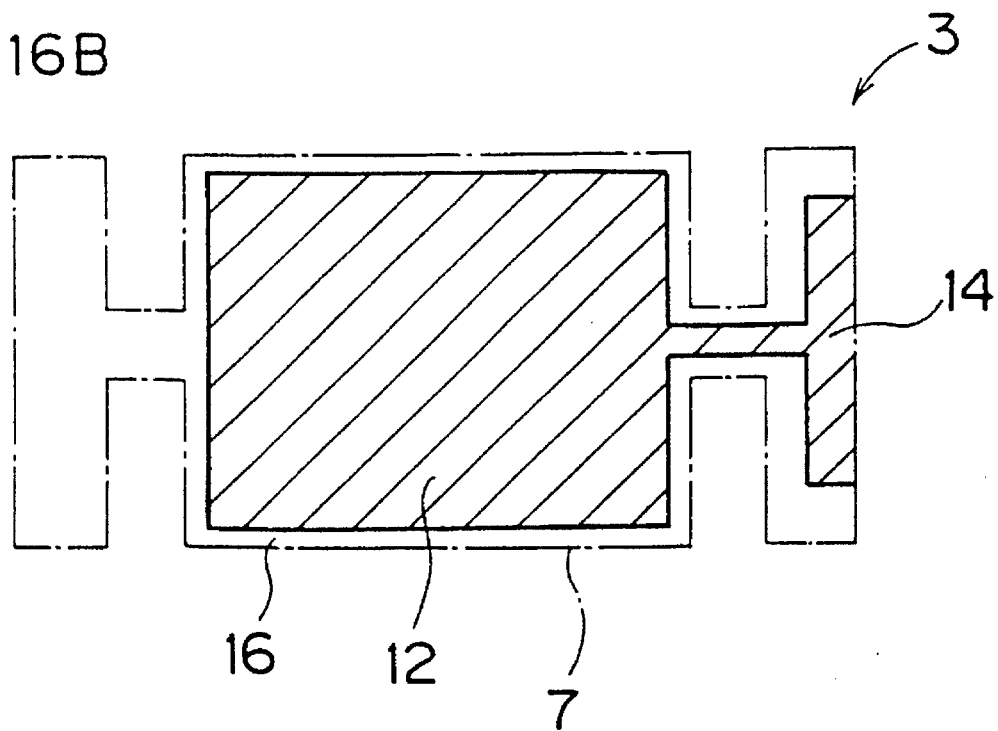

FIGS. 16A and 16B are a plan view for illustrating an electrode shape of the piezo-resonator 3 and a typical plan view showing a lower electrode shape through the piezoelectric ceramic plate respectively.

In the piezo-resonator 3, the piezoelectric resonance part 7 has a rectangular plate shape, so that the ratio b/a of the length b of the longer sides to the length a of the shorter sides thereof is in the range of ±10% about a value satisfying the aforementioned equation (1).

In the piezo-resonator 3, further, the piezoelectric resonance part 7, the coupling parts 8a and 8b and the support parts 9 and 10 are integrally formed by machining a piezoelectric ceramic plate. Alternatively, the piezoelectric resonance part 7, the coupling parts 8a and 8b and the support parts 9 and 10 may be formed independently of each other, to be coupled to and integrated with each other through adhesives or the like.

A first resonance electrode 11 is formed on an upper surface of the piezoelectric resonance part 7, while a second resonance electrode 12 is formed on its lower surface to be opposed to the first resonance electrode 11. The resonance electrodes 11 and 12 are electrically connected to lead electrodes 13 and 14 which are formed on an upper surface of the support part 9 and a lower surface of the support part 10 respectively.

In the piezoelectric resonance part 7, the piezoelectric ceramic plate is polarized along its thickness. When an alternating voltage is applied across the resonance electrodes 11 and 12, therefore, the piezoelectric resonance part 7 is excited in a width expansion mode, similarly to the piezo-resonator 211 shown in FIG. 12. Further, the coupling parts 8a and 8b are coupled to substantially central portions of shorter sides of the piezoelectric resonance part 7, also similarly to the piezo-resonator 211 shown in FIG. 12. Therefore, vibrational energy of the width expansion mode is trapped in the piezoelectric resonance part 7, to hardly leak toward the coupling parts 8a and 8b.

In the piezo-resonator 3 shown in FIGS. 16A and 16B, the resonance electrodes 11 and 12 are not formed on the overall major surfaces of the piezoelectric resonance part 7, but leave regions 15 and 16 of prescribed widths in the peripheries. In the piezoelectric resonance part 7, however, the ratio of the length of the longer sides to that of the shorter sides is set in the aforementioned range, whereby the piezoelectric resonance part 7 is excited in the width expansion mode, similarly to the piezo-resonator 211 (FIG. 12).

Referring again to FIG. 15, the piezo-resonator 3 is fixed to the base substrate 2 at the support parts 9 and 10 by conductive adhesives 17a and 17b respectively. Namely, the conductive adhesives 17a and 17b electrically connect the lead electrodes 13 and 14 to the terminal electrodes 5a and 5b respectively. Further, the conductive adhesives 17a and 17b fix the support parts 9 and 10 to the base substrate 2. The conductive adhesives 17a and 17b are formed to extend toward lower surfaces of the support parts 9 and 10 respectively, whereby the piezoelectric resonance part 7 is fixed to the base substrate 2 in a state separated from the upper surface of the base substrate 2 through a gap region of a prescribed thickness. Thus, the piezo-resonator 3 is so fixed to the base substrate 2 as to allow vibration of the piezoelectric resonance part 7.

According to this embodiment, the cap member 4 is fixed onto the base substrate 2, to which the aforementioned piezo-resonator 3 is fixed. The cap member 4, which is made of an insulating material such as synthetic resin or a material prepared by insulating a metal surface, is bonded/fixed to the base substrate 2 through an insulating adhesive. This cap member 4 is provided in the form of a rectangular parallelopiped having an open lower portion, in dimensions capable of enclosing the piezo-resonator 3 therein.

Figure 17:
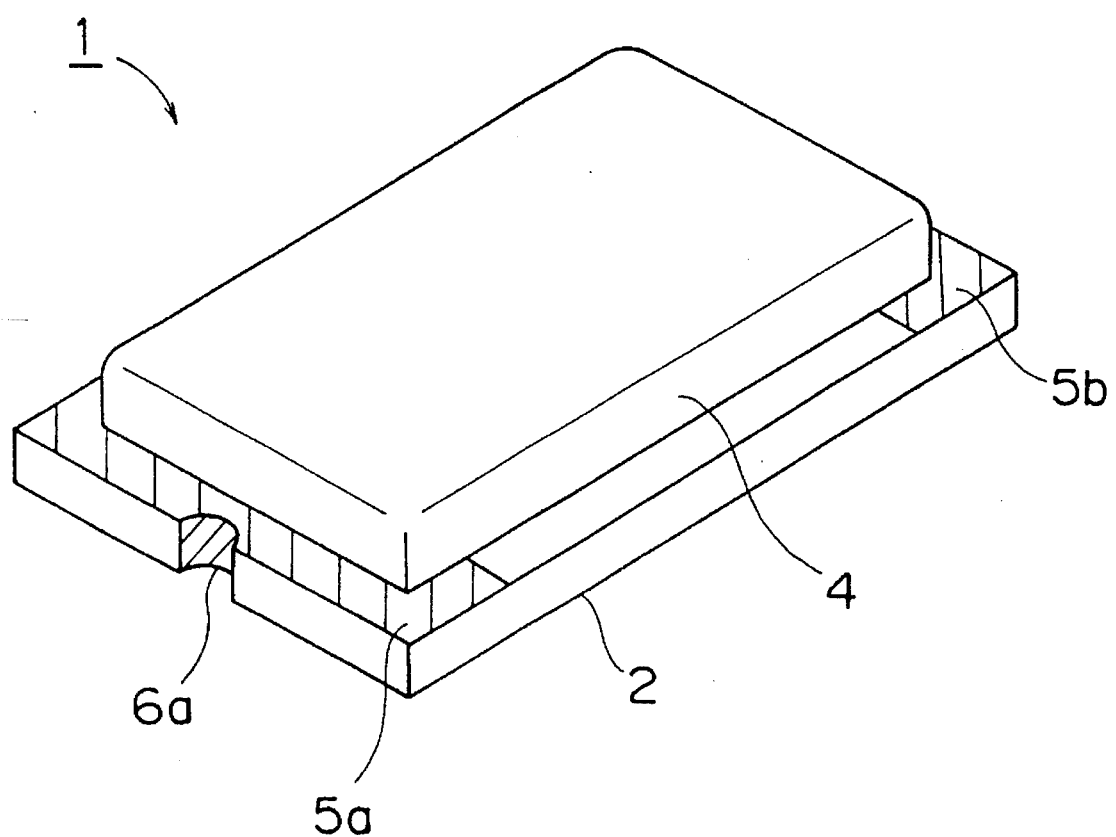
FIG. 17 is a perspective view showing the chip-type piezoelectric resonance component according to the first embodiment.

FIG. 17 is a perspective view showing the chip-type piezoelectric resonance component 1 according to this embodiment, which is obtained by fixing the cap member 4 onto the base substrate 2. In the chip-type piezoelectric resonance component 1, the terminal electrodes 5a and 5b are formed on the upper surface of the base substrate 2, while the notches 6a and 6b (see FIG. 15) are formed in the side surfaces, so that the terminal electrodes 5a and 5b reach the inner peripheral surfaces of these notches 6a and 6b. Therefore, the chip-type piezoelectric resonance component 1 can be surface-mounted on a printed circuit board or the like, so that the terminal electrodes 5a and 5b are readily connected to electrode lands or wiring patterns provided thereon.

In the chip-type piezoelectric resonance component 1 according to this embodiment, the piezo-resonator 3 utilizes the aforementioned width expansion mode, whereby a chip-type piezoelectric resonance component employing an energy-trap piezo-resonator of the kHz band can be readily provided. Further, it is understood possible to form a chip-type piezoelectric resonance component having desired characteristics by a simple fixation structure employing the base substrate 2 and the cap member 4, due to the employment of the aforementioned energy-trap piezo-resonator 3.

Second Embodiment

Figure 19:
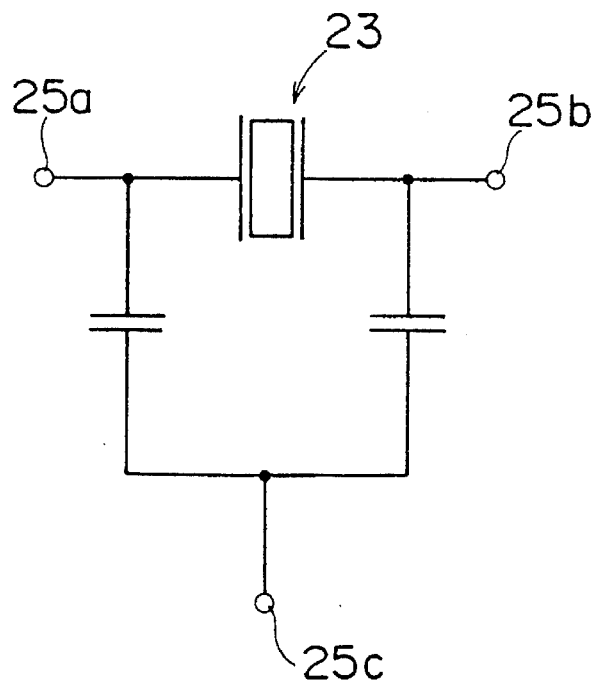
FIG. 19 illustrates an equivalent circuit of the chip-type piezoelectric resonance component according to the second embodiment.
Figure 20:
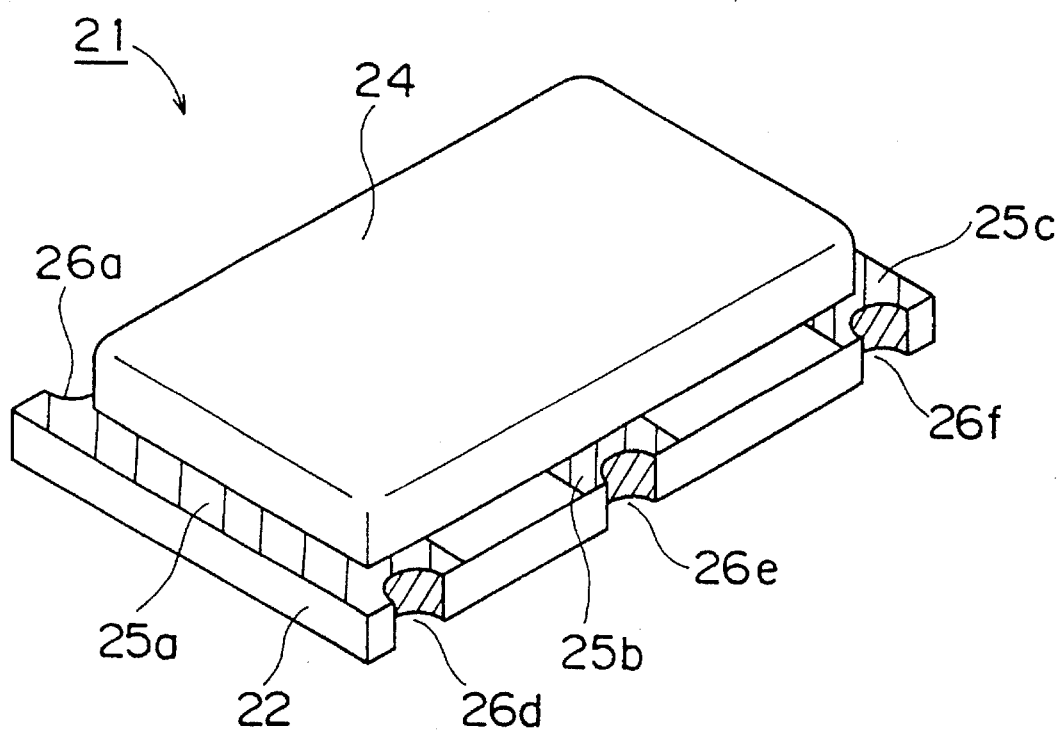
FIG. 20 is a perspective view showing the chip-type piezoelectric resonance component according to the second embodiment.

A chip-type piezoelectric resonance component 21 according to a second embodiment of the present invention is now described with reference to FIGS. 18 to 20. The chip-type piezoelectric resonance component 21 according to the second embodiment is applied to a three-terminal piezo-oscillator having built-in capacitance.

Figure 18:
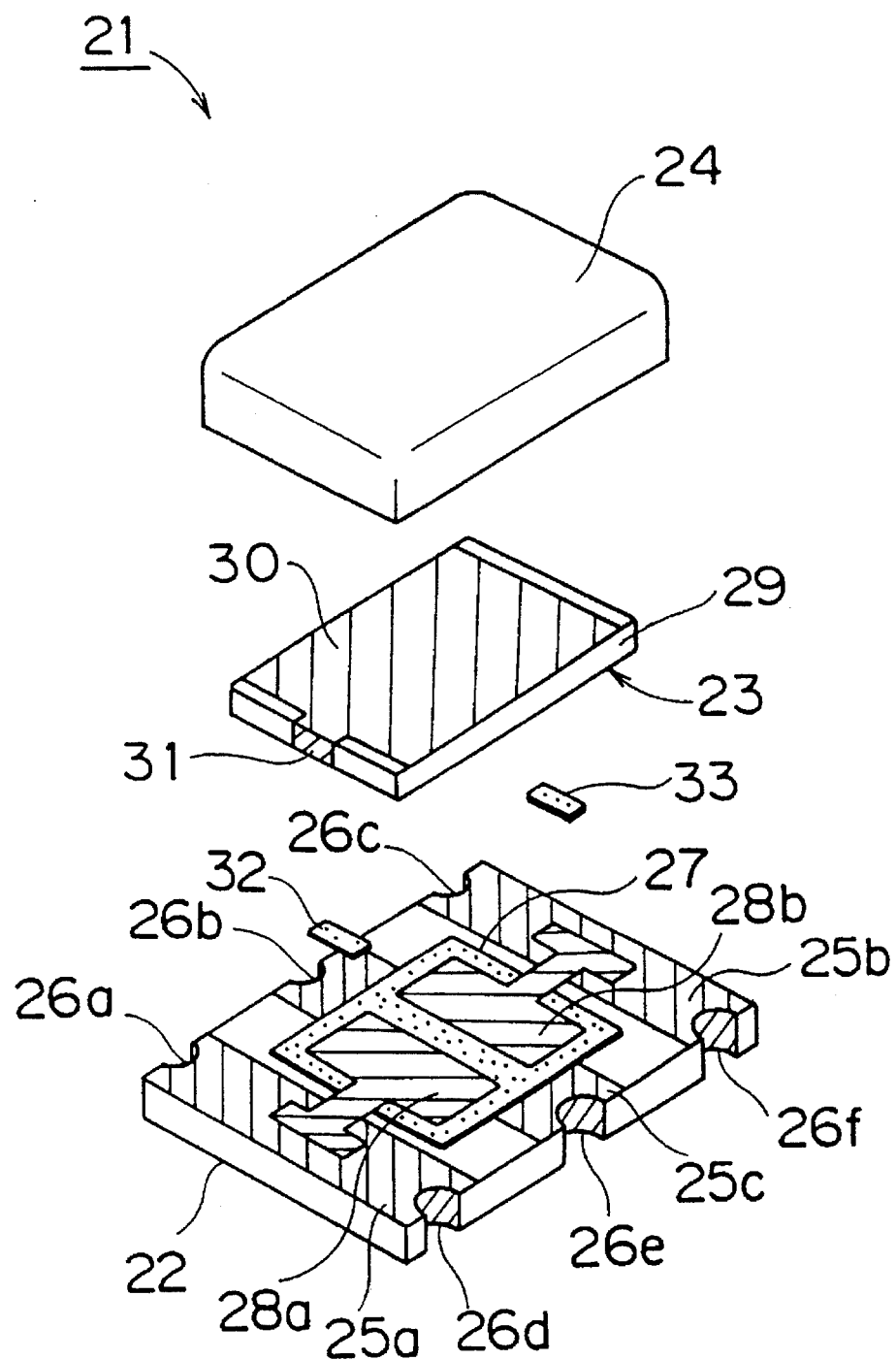
FIG. 18 is an exploded perspective view for illustrating a chip-type piezoelectric resonance component according to a second embodiment of the present invention.

Referring to FIG. 18, the chip-type piezoelectric resonance component 21 according to this embodiment has a base substrate 22, a piezo-resonator 23 utilizing a width expansion mode which is fixed onto the base substrate 22, and a cap member 24. The cap member 24 is formed similarly to the cap member 4 of the first embodiment.

The base substrate 22, which is made of insulating ceramics such as alumina or an insulating material such as synthetic resin, has a rectangular plate shape. Terminal electrodes 25a and 25b are formed on an upper surface of the base substrate 22, to be along shorter side edges thereof. Still another terminal electrode 25c is formed on a central region of the base substrate 22 in parallel with the terminal electrodes 25a and 25b. Further, notches 26a to 26c and 26d to 26f are formed in longer side edges of the base substrate 22, to facilitate solder connection for mounting the piezoelectric resonance component 21 on a printed circuit board. Each of the terminal electrodes 25a to 25c is so formed as to reach any two of the notches 26a to 26f.

On the other hand, a dielectric film 27 is formed on a central region of the base substrate 22, to have a rectangular shape. This dielectric film 27 is formed on the terminal electrode 25c, not to be in contact with the terminal electrodes 25a and 25b. The dielectric film 27 is formed by applying barium titanate ceramic paste or synthetic resin paste and hardening the same, for example, in order to extract electrostatic capacitance. Electrodes 28a and 28b are formed on an upper surface of the dielectric film 27, in order to form capacitors with the terminal electrode 25c through the dielectric film 27. The electrodes 28a and 28b are electrically connected with the terminal electrodes 25a and 25b respectively.

The piezo-resonator 23 is formed by a rectangular plate type piezoelectric ceramic plate 29, and provided with only a piezoelectric resonance part. Namely, the piezoelectric ceramic plate 29 is polarized along its thickness, and a ratio b/a is selected to be in the range of ±10% about a value satisfying the aforementioned equation (1) assuming that a and b represent lengths of shorter and longer sides of upper and lower surfaces thereof.

Further, a first resonance electrode 30 is formed on the upper surface of the piezoelectric ceramic plate 29. The first resonance electrode 30 is electrically connected with a lead electrode 31 which is formed on a substantially central portion of one shorter side surface of the piezoelectric ceramic plate 29. A second resonance electrode (not shown in FIG. 18) is also formed on the lower side to be opposed to the first resonance electrode 30, and electrically connected to a lead electrode (not shown) which is formed on a substantially central portion of another shorter side surface which is opposite to that provided with the lead electrode 31.

When an alternating voltage is applied across the first and second resonance electrodes provided on the upper and lower surfaces, therefore, the piezo-resonator 23 is excited in a width expansion mode. Since the lead electrode 31 and that formed on the opposite side surface are formed on vibration nodal points, the piezo-resonator 23 can be fixed to the base substrate 22 through the lead electrode 31 and that provided on the opposite side surface while allowing the vibration of the width expansion mode.

According to this embodiment, the piezo-resonator 23 is fixed onto the base substrate 22 through conductive adhesives 32 and 33. Namely, the lead electrode 31 is electrically connected with the terminal electrode 25a through the conductive adhesive 32, while the portion provided with the lead electrode 31 is physically fixed to the base substrate 22. Similarly, the lead electrode provided on the side surface which is opposite to that of the lead electrode 31 is electrically connected with the terminal electrode 25b through the conductive adhesive while the portion provided with this lead electrode is physically fixed to the base substrate 22.

The conductive adhesives 32 and 33 are applied in thicknesses capable of separating the lower surface of the piezoelectric ceramic plate 29 from the electrodes 28a and 28b through a gap region of a prescribed thickness. Therefore, the piezo-resonator 23 is allowed to vibrate in the width expansion mode in the state fixed to the base substrate 22. Preferably, an insulating layer may be formed on the electrodes 28a and 28b, in order to prevent a short across the second resonance electrode which is formed on the lower surface of the piezo-resonator 23 and the electrodes 28a and 28b for extracting capacitance. Also in this case, a gap of a prescribed thickness is preferably defined between the insulating layer and the piezoelectric ceramic plate 29, to allow vibration of the piezo-resonator 23.

The cap member 24 is fixed to the base substrate 22 through an adhesive, similarly to the cap member 4 of the first embodiment. Thus, the chip-type piezoelectric resonance component 21 shown in FIG. 20 is formed. FIG. 19 illustrates an equivalent circuit of the chip-type piezoelectric resonance component 21. As clearly understood from FIG. 19, a three-terminal piezo-oscillator having built-in capacitance is formed in this embodiment, with the terminal electrodes 25a to 25c serving as terminals.

Also in the second embodiment, the piezo-resonator 23 is formed through the width expansion mode and fixed to the base substrate 22 through the vibration nodal points, whereby it is possible to provide an energy-trap chip-type piezoelectric resonance component which can implement desired frequency characteristics with a simple fixation structure dissimilarly to the prior art.

Third Embodiment

Figure 21:
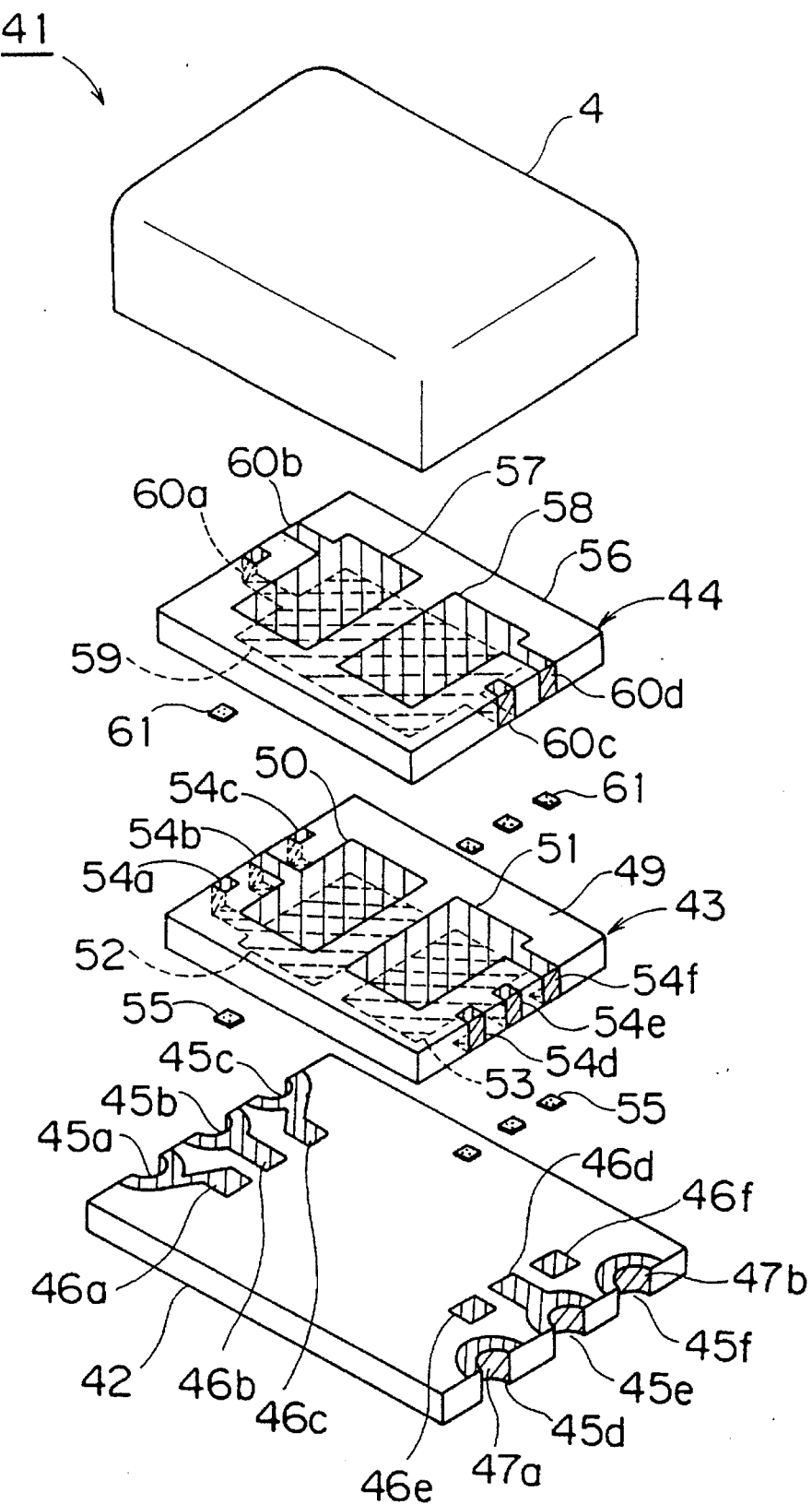
FIG. 21 is an exploded perspective view for illustrating a chip-type piezoelectric resonance component according to a third embodiment of the present invention.

FIG. 21 is an exploded perspective view showing a chip-type piezoelectric resonance component 41 according to a third embodiment of the present invention. The chip-type piezoelectric resonance component 41 is applied to a single mode piezoelectric filter.

In this embodiment, a plurality of piezo-resonators 43 and 44 are fixed onto a base substrate 42, while a cap member 4 is also fixed to the base substrate 42.

The base substrate 42 is made of a material which is similar to that for the base substrate 2 of the first embodiment, and provided with a plurality of notches 45a to 45c and 45d to 45f in shorter side surfaces thereof. On an upper surface of the base substrate 42, terminal electrodes 46a to 46c are formed in positions close to one shorter side surface. The terminal electrodes 46a to 46c are formed at prescribed distances, to reach the notches 45a to 45c respectively.

In positions close to another shorter side surface, on the other hand, a terminal electrode 46d is formed at the center while connecting electrodes 46e and 46f are formed on both sides of the terminal electrode 46d. The terminal electrode 46d is formed to reach an inner peripheral surface of the notch 45e. Further, electrodes 47a and 47b are formed also on inner peripheral surfaces of the notches 45d and 45f respectively.

The piezo-resonator 43, which is formed by a rectangular plate type piezoelectric ceramic plate 49, utilizes a width expansion mode. In this piezo-resonator 43, a plurality of resonance electrodes are formed on upper and lower surfaces of the piezoelectric ceramic plate 49, to form a filter circuit.

The piezoelectric ceramic plate 49 is uniformly polarized along its thickness, while a ratio b/a in relation to its upper and lower surfaces is selected to be within the range of ±10% about a value satisfying the aforementioned equation (1).

On the other hand, a pair of rectangular resonance electrodes 50 and 51 are formed on the upper surface of the piezoelectric ceramic plate 49 at a prescribed distance. Further, another pair of resonance electrodes 52 and 53 are formed on the lower surface, to be opposed to the resonance electrodes 50 and 51 respectively. In addition, electrodes 54a to 54c are formed on substantially central portions of one shorter side surface of the piezoelectric ceramic plate 49. The electrode 54a is electrically connected with the resonance electrode 50. The electrode 54b is also electrically connected to the resonance electrode 50. The electrode 54c is formed on the shorter side surface to reach the upper and lower surfaces. This electrode 54c is not electrically connected with the resonance electrodes 50 and 52.

Similarly, electrodes 54d to 54f are formed on substantially central portions of the other side surface. The electrode 54d is not electrically connected to the resonance electrodes 51 and 53. The electrode 54e is electrically connected to the resonance electrode 53 which is formed on the lower surface, while the electrode 54f is electrically connected to the resonance electrode 51 which is formed on the upper surface.

The electrodes 54a to 54c and 54d to 54f are electrically connected to the terminal electrodes 46a to 46f which are formed on the upper surface of the base substrate 42 through conductive adhesives 55 respectively. The conductive adhesives 55 are applied to have prescribed thicknesses, similarly to those employed in the first and second embodiments. Thus, the piezo-resonator 43 is fixed onto the base substrate 42 through a space of a prescribed thickness.

The piezo-resonator 44 is formed by a piezoelectric ceramic plate 56, which is formed similarly to the piezoelectric ceramic plate 49. This piezoelectric ceramic plate 56 is also uniformly polarized along its thickness.

A pair of resonance electrodes 57 and 58 are formed on an upper surface of the piezoelectric ceramic plate 56, while a common resonance electrode 59 is formed on its lower surface to be opposed to the resonance electrodes 57 and 58.

Further, electrodes 60a and 60b are formed on substantially central portions of one shorter side surface of the piezoelectric ceramic plate 56, while electrodes 60c and 60d are formed on substantially central portions of the other shorter side surface. The electrodes 60a and 60b are electrically connected to the common resonance electrode 59 and the resonance electrode 57 respectively. Similarly, the electrodes 60c and 60d are electrically connected to the common resonance electrode 59 and the resonance electrode 58 respectively.

The piezo-resonator 44 is fixed to the upper surface of the piezo-resonator 43, through conductive adhesives 61 which are applied to the portions provided with the electrodes 60a to 60d. In this case, the conductive adhesives 61 are so applied as to have prescribed thicknesses. Thus, a lower surface of the piezo-resonator 44 is separated from the upper surface of the piezo-resonator 43 through a gap region of a prescribed thickness, whereby the piezo-resonators 43 and 44 are allowed to vibrate in a width expansion mode.

Figure 22:
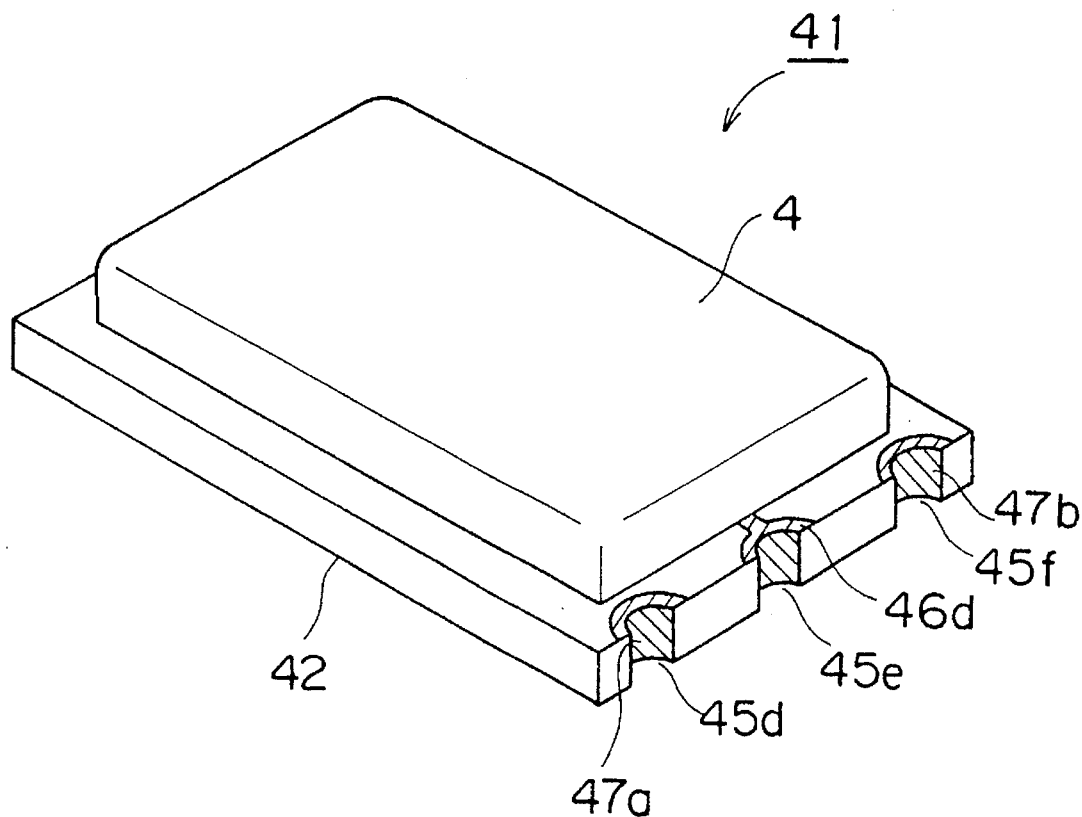
FIG. 22 is a perspective view showing the appearance of the chip-type piezoelectric resonance component according to the third embodiment.

The chip-type piezoelectric resonance part 41 shown in FIG. 22 can be obtained by fixing the piezo-resonators 43 and 44 onto the base substrate 42 through the conductive adhesives 55 and 61 and further fixing the cap member 4.

Figure 23:
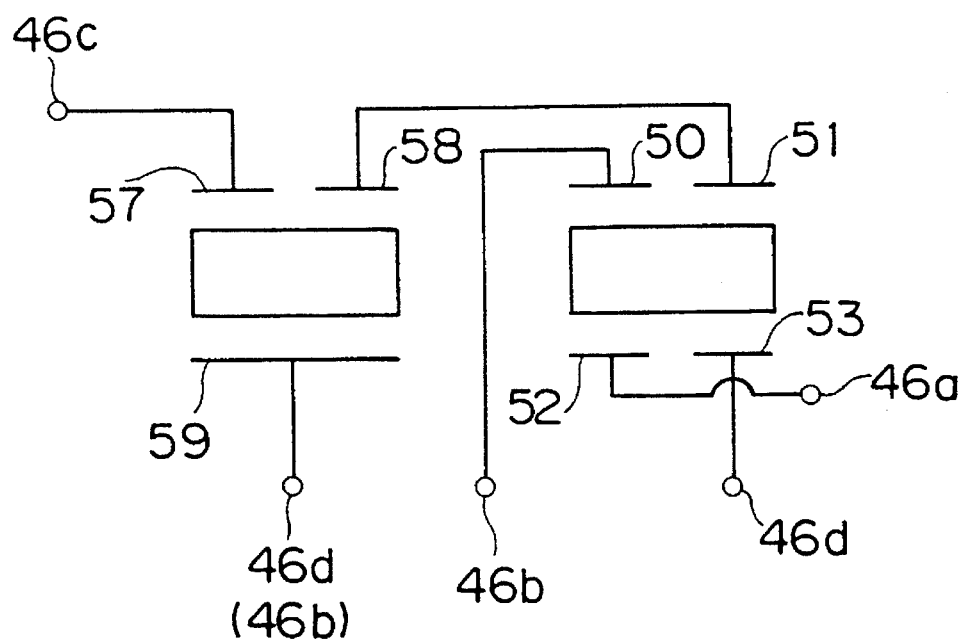
FIG. 23 illustrates an equivalent circuit of the chip-type piezoelectric resonance component according to the third embodiment.

FIG. 23 illustrates an equivalent circuit of the chip-type piezoelectric resonance component 41 according to this embodiment. As clearly understood from FIG. 23, a single mode two-element connection type piezoelectric filter employing the two piezo-resonators 43 and 44 is formed according to this embodiment. Also in this embodiment, the piezo-resonators 43 and 44 are formed by the piezoelectric ceramic plates 49 and 56 whose ratios b/a are decided to be in the range of ±10% about values satisfying the above equation (1), whereby width expansion mode vibration is excited, while this width expansion mode vibration is hardly influenced by the fixation structure since the piezo-resonators 43 and 44 are fixed at the substantially central portions of the shorter sides of the piezoelectric ceramic plates 49 and 56. Thus, it is understood possible to readily form the aforementioned two-element connection type single mode piezoelectric filter employing the energy-trap piezo-resonators 43 and 44 utilizing the width expansion mode, and this piezoelectric filter can be formed through the relatively simple structure of the piezo-resonators 43 and 44, the base substrate 42 and the cap member 4.

Fourth Embodiment

Figure 24:
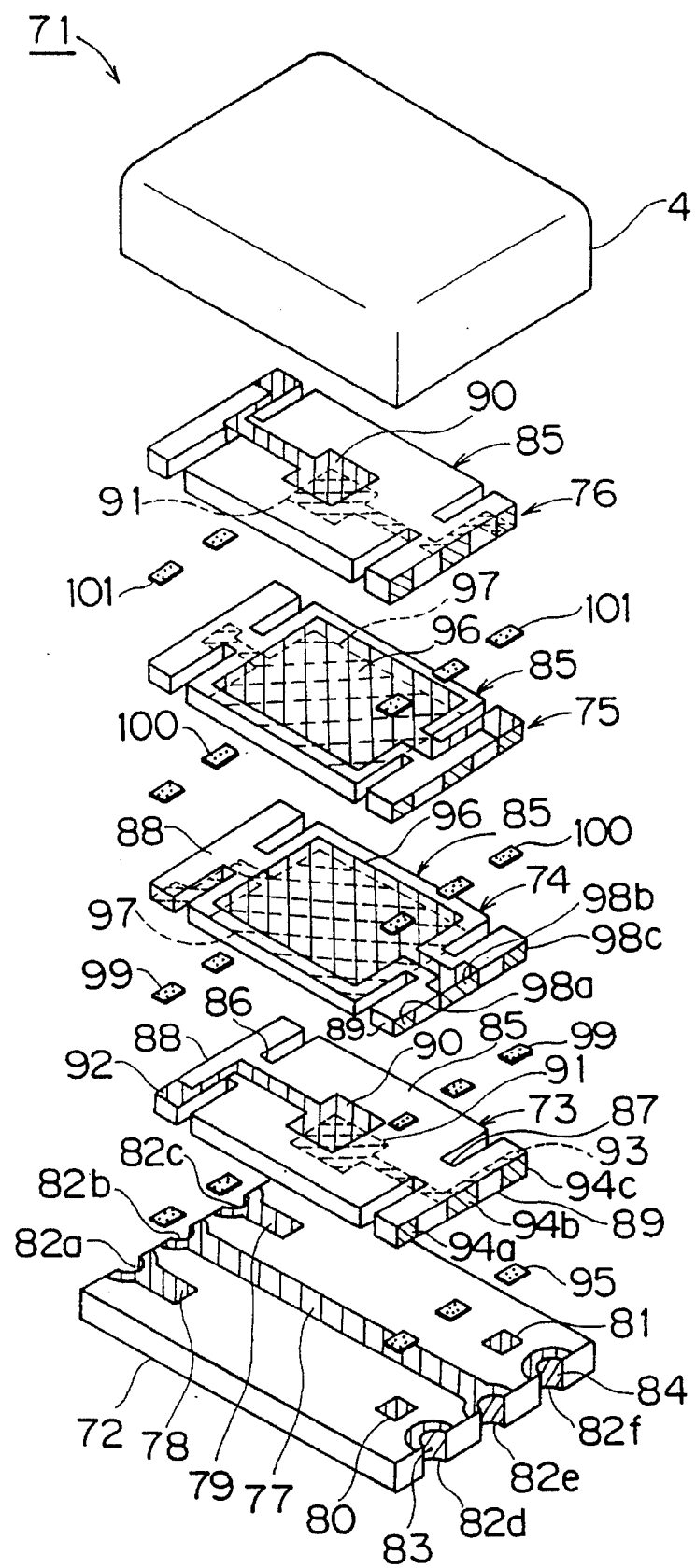
FIG. 24 is an exploded perspective view for illustrating a chip-type piezoelectric resonance component according to a fourth embodiment of the present invention.

FIG. 24 is an exploded perspective view for illustrating a chip-type piezoelectric resonance component 71 according to a fourth embodiment of the present invention.

The chip-type piezoelectric resonance component 71 according to the fourth embodiment is applied to a ladder-type filter which is formed by four piezo-resonators.

In the chip-type piezoelectric resonance component 71, piezo-resonators 73 to 76 are stacked with each other and fixed to a base substrate 72. Further, a cap member 4 is mounted to enclose the multilayer structure of the piezo-resonators 73 to 76. The cap member 4 is formed similarly to that employed in the first embodiment.

The base substrate 72, which is made of insulating ceramics such as alumina or an insulating material such as synthetic resin, has a rectangular plate shape provided with rectangular upper and lower surfaces, as shown in FIG. 24.

A terminal electrode 77 is formed on a central region of the base substrate 72, to extend in a direction coupling both shorter sides with each other. In a region close to one shorter side, terminal electrodes 78 and 79 are formed on both sides of the terminal electrode 77. In a region close to the other shorter side, on the other hand, electrodes 80 and 81 are formed. Further, notches 82a to 82c and 82d to 82f are formed on both shorter side surfaces of the base substrate 72 respectively. The terminal electrode 77 is formed to extend toward the notches 82b and 82e. Similarly, the terminal electrodes 78 and 79 are formed to reach inner peripheral surfaces of the notches 82a and 82c respectively.

Further, terminal electrodes 88 and 84 are formed in the notches 82d and 82f respectively.

The piezo-resonators 78 to 76 are common with each other in a point that the same are provided with rectangular plate type piezoelectric resonance parts 85 and support parts 88 and 89 which are coupled to substantially central portions of shorter side surfaces of the piezoelectric resonance parts 85 through coupling parts 86 and 87 respectively. However, electrode structures of the piezo-resonators 73 to 76 are different from each other as described later. Therefore, the piezo-resonator 73 is first described, followed by description of only the electrode structures of the piezo-resonators 74 to 76.

In the piezo-resonator 73, the piezoelectric resonance part 85, the coupling parts 86 and 87 and the support parts 88 and 89 are formed by working a piezoelectric ceramic plate. The piezoelectric resonance part 85 is uniformly polarized along its thickness, and a ratio b/a is set to be in the range of ±10% about a value satisfying the aforementioned equation (1) in relation to upper and lower surfaces thereof. When an alternating voltage is applied across both major surfaces, therefore, the piezoelectric resonance part 85 is excited in a width expansion mode.

In the piezo-resonator 73, a first resonance electrode 90 is formed on the upper surface of the piezoelectric resonance part 85, while a second resonance electrode 91 is formed on the lower surface to be opposed to the first resonance electrode 90. The resonance electrodes 90 and 91, which have rectangular plane shapes, are formed to have areas considerably smaller than those of the upper and lower surfaces of the piezoelectric resonance part 85. Further, the resonance electrodes 90 and 91 are electrically connected to lead electrodes 92 and 93 which are formed on an upper surface of the support part 88 and a lower surface of the support part 89 respectively. On the support part 89, connecting electrodes 94a to 94c are formed at prescribed distances, so that the lead electrode 93 is electrically connected to the electrode 94c. Also on the support part 88, three connecting electrodes are formed on an outer side surface at prescribed distances, so that the lead electrode 92 is electrically connected to one of these connecting electrodes.

The piezo-resonator 73 is physically fixed to the base substrate 72 through conductive adhesives 95 which are applied to positions corresponding to the electrodes 94a to 94c, and electrically connected to the terminal electrode 77 etc. provided on the base substrate 72. The thicknesses of the conductive adhesives 95 are so selected that the lower surface of the piezoelectric resonance part 85 is separated from the base substrate 72 through a gap region of a prescribed thickness. When the piezoelectric resonance part 85 of the piezo-resonator 7S which is fixed to the base substrate 72 is excited in a width expansion mode, therefore, its vibration is not inhibited.

In the piezo-resonator 74, on the other hand, first and second resonance electrodes 96 and 97 are formed on upper and lower surfaces of the piezoelectric resonance part 85 respectively. The first and second resonance electrodes 96 and 97 are formed in dimensions occupying most regions of the upper and lower surfaces of the piezoelectric resonance part 85 respectively. Namely, the first and second resonance electrodes 96 and 97 have larger areas as compared with the first and second resonance electrodes 90 and 91 of the piezo-resonator 79. In the piezo-resonator 74, therefore, electrostatic capacitance across the resonance electrodes 96 and 97 is larger than that across the resonance electrodes 90 and 91 of the piezo-resonator 73.

Further, the resonance electrode 96 is electrically connected to a connecting electrode 98b which is formed on a side surface of the support part 89. Electrodes 98a and 98c are formed on both sides of the connecting electrode 98b.

Similarly, a connecting electrode which is connected to the resonance electrode 97 is formed also on an outer side surface of the support part 88. Further, two connecting electrodes are formed in addition to that connected to the resonance electrode 97, similarly to the support part 89 side.

The piezo-resonator 74 is fixed onto the piezo-resonator 73 through conductive adhesives 99. Namely, the connecting electrode 98b of the piezo-resonator 74 is electrically connected to a connecting electrode 94b of the lower piezo-resonator 73 through the conductive adhesive 99. Similarly, the connecting electrode which is connected to the resonance electrode 97 is electrically connected to the lead electrode 92 of the piezo-resonator 73 through the conductive adhesive 99.

The thicknesses of the conductive adhesives 99 are also selected so that the piezoelectric resonance parts 85 of the piezo-resonators 74 and 73 are separated from each other through a space, similarly to the conductive adhesives 95. Therefore, the piezoelectric resonance parts 85 of the piezo-resonators 73 and 74 which are fixed to each other are not inhibited from vibration.

The piezo-resonator 75 is formed similarly to the piezo-resonator 74, except electrode drawout portions. On the other hand, the piezo-resonator 76 is formed similarly to the piezo-resonator 73, except electrode drawout positions. These piezo-resonators 75 and 76 are also successively stacked and fixed to each other through conductive adhesives 100 and 101. Thus, the piezo-resonators 73 to 76 are stacked with each other and the cap member 4 is fixed to the base substrate 72 to enclose the multilayer structure, thereby providing the chip-type piezoelectric resonance component 71 according to this embodiment.

Figure 25:
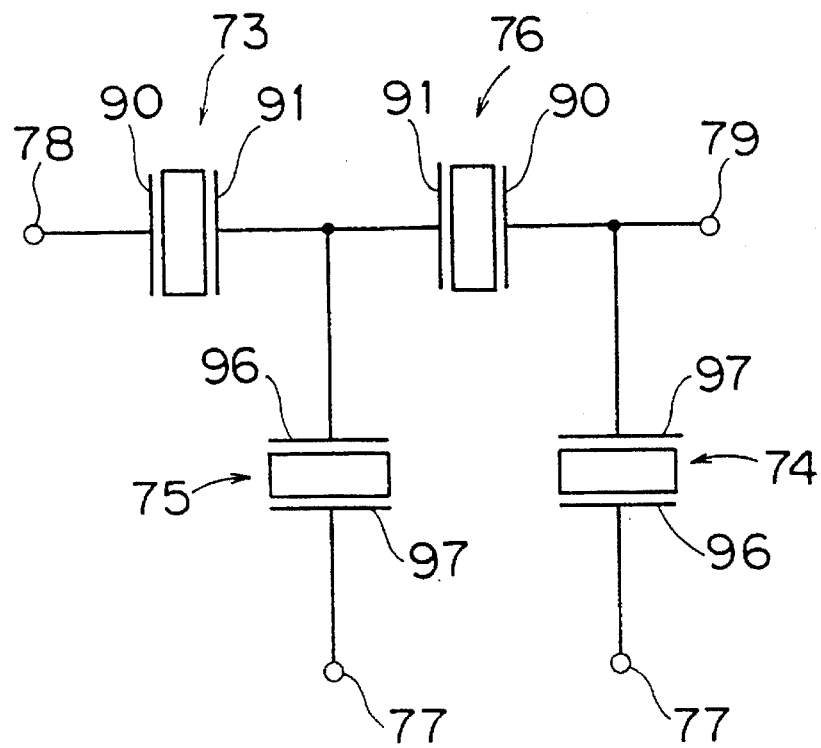
FIG. 25 illustrates an equivalent circuit of the chip-type piezoelectric resonance component according to the fourth embodiment.

The piezo-resonators 73 to 76 are electrically connected to each other to form a two-stage ladder-type filter, as shown in FIG. 25.

In the chip-type piezoelectric resonance component 71 according to this embodiment, therefore, a ladder-type filter capable of exhibiting desired characteristics can be readily formed by simply fixing the piezo-resonators 73 to 76 utilizing a width expansion mode to the base substrate 72 through conductive adhesives, fixing the same with each other through conductive adhesives, and thereafter fixing the cap member 4 to the base substrate 72.

Namely, the respective piezo-resonators 73 to 76 utilize the width expansion mode, whereby it is understood that the support structure for the piezo-resonators 73 to 76 can be simplified as described above and the plurality of piezo-resonators 73 to 76 can be readily integrated with each other.

Fifth Embodiment

Figure 26:
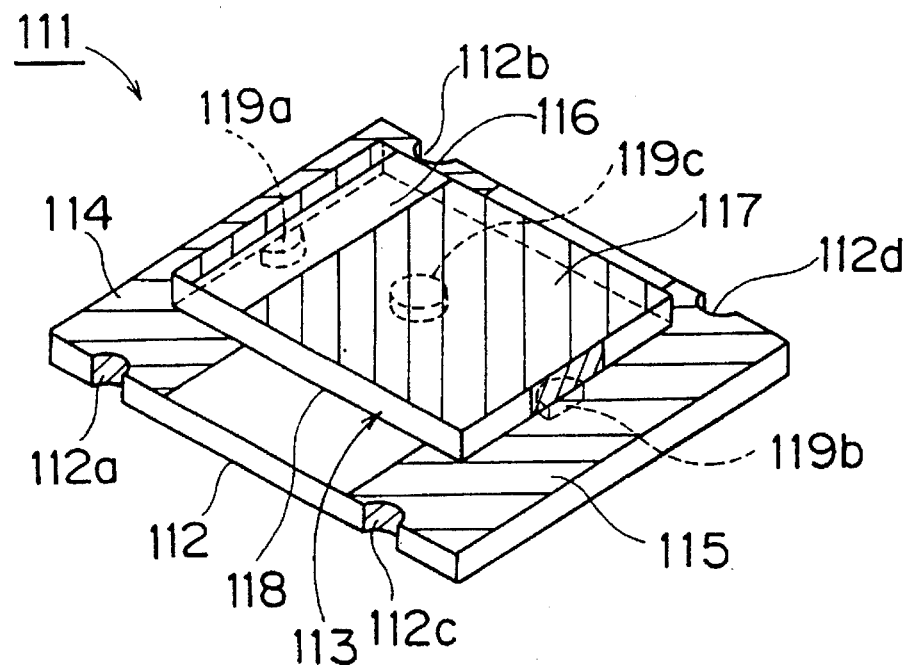
FIG. 26 is a perspective view for illustrating a chip-type piezoelectric resonance component according to a fifth embodiment of the present invention.

FIG. 26 is a perspective view for illustrating a chip-type piezoelectric resonance component 111 according to a fifth embodiment of the present invention. In the chip-type piezoelectric resonance component 111 according to this embodiment, a piezo-resonator 113 is fixed onto a base substrate 112. Terminal electrodes 114 and 115 are formed on an upper surface of the base substrate 112. The terminal electrode 114 is formed to reach notches 112a and 112b for facilitating mounting on a printed circuit board. Similarly, the terminal electrode 115 is also formed to reach notches 112c and 112d. The piezo-resonator 113 is formed by only a rectangular plate type piezoelectric resonance part. Namely, first and second resonance electrodes 117 and 118 are formed on upper and lower surfaces of a rectangular plate type piezo-electric ceramic plate 116, which is polarized along its thickness, respectively. In the piezoelectric ceramic plate 116, the aforementioned ratio b/a is selected to be capable of exciting width expansion mode vibration. The feature of this embodiment resides in that the piezo-resonator 113 is fixed to the piezoelectric ceramic plate 116 not only at substantially central portions of shorter side surfaces but at the center of the lower surface. Namely, the piezo-resonator 113 is fixed to the base substrate 112 through conductive adhesives 119a and 119b at the substantially central portions of the shorter side surfaces as well as through a conductive adhesive 119c at the center of the lower surface. The conductive adhesive 119c, which may not serve a function of attaining electrical connection, may be replaced by an insulating adhesive.

Also in this embodiment, a cap member is fixed to the base substrate 112, similarly to the first to fourth embodiments.

As clearly understood from the fifth embodiment, the piezo-resonator 113 utilizing the width expansion mode may be fixed to the base substrate 112 not only at the centers of both shorter sides but at the center of the rectangular surface. Alternatively, the same may be mechanically fixed to the base substrate 112 at the center of the lower surface, so that only electrical connection is attained at the centers of both shorter sides.

Modifications

While the piezo-resonator is fixed to the base substrate through the adhesives in each of the aforementioned first to fifth embodiments, the piezo-resonator may alternatively be fixed to the base substrate through members other than the adhesives.

Figure 27:
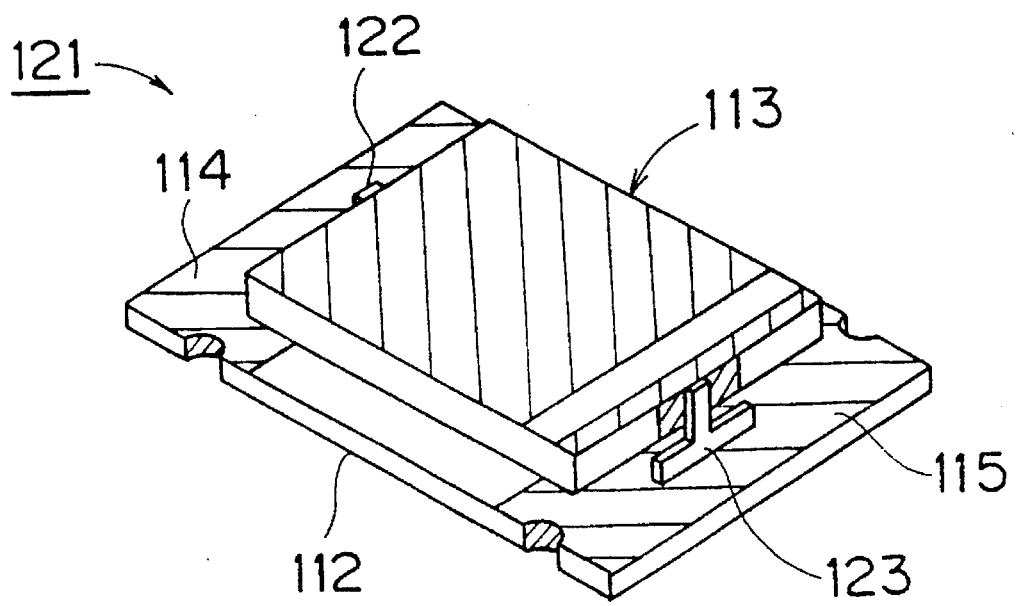
FIG. 27 is a perspective view showing a modification of a piezo-resonator which is fixed by metal terminals.

FIG. 27 is a perspective view showing a piezoelectric resonance component 121 having such a structure that a piezo-resonator is fixed to a base substrate through metal terminals. A piezo-resonator 113 which is similar in structure to that employed in the fifth embodiment is fixed onto a base substrate 112. This piezo-resonator 113 is fixed to the base substrate 112 through metal terminals 122 and 123. The metal terminals 122 and 123 are electrically connected and fixed to terminal electrodes 114 and 115 on lower ends thereof respectively. This fixation can be attained by solder (not shown) or the like. On the other hand, portions of the metal terminals 122 and 123 close to upper ends thereof are electrically connected to lead electrodes which are formed on centers of shorter side surfaces of the piezo-resonator 113 by solder or the like.

The heights of the metal terminals 122 and 123 are so selected that a lower surface of the piezo-resonator 113 is separated from an upper surface of the base substrate 112 through a gap region of a prescribed thickness.

Figure 28:
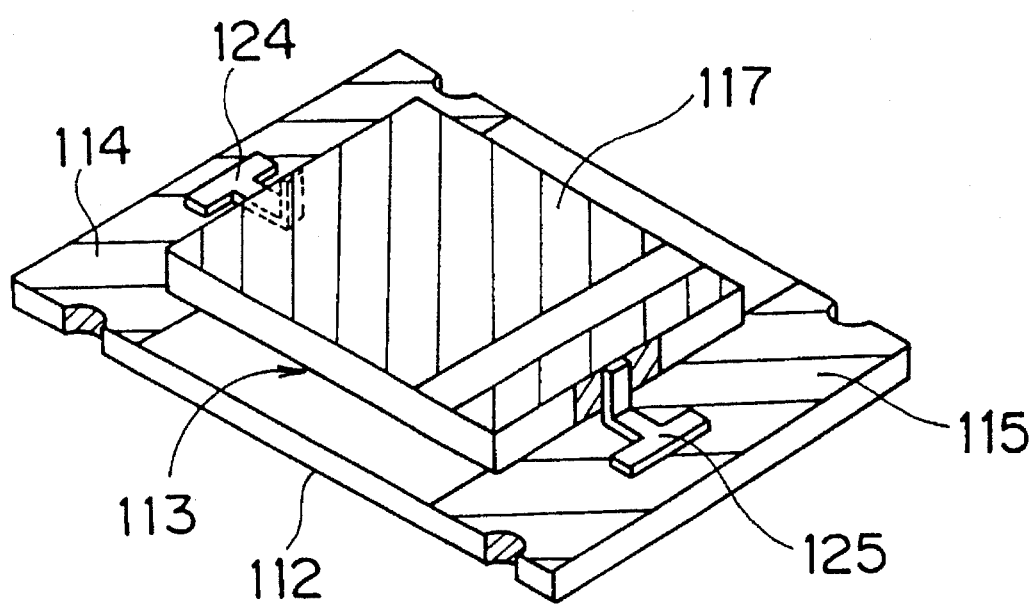
FIG. 28 is a perspective view showing another modification of a piezo-resonator which is fixed by metal terminals.

FIG. 28 illustrates a modification of the piezoelectric resonance component 121, in which metal terminals 124 and 125 are so bent that portions bonded to terminal electrodes 114 and 115 extend in the horizontal direction. Other points of this modification are similar to those of the piezoelectric resonance component 121. Also in the modification shown in FIG. 28, lengths of vertically extending portions of the metal terminals 124 and 125 are so selected that a lower surface of a piezo-resonator 118 is separated from an upper surface of a base substrate 112 through a gap region of a prescribed thickness.

Figure 29:
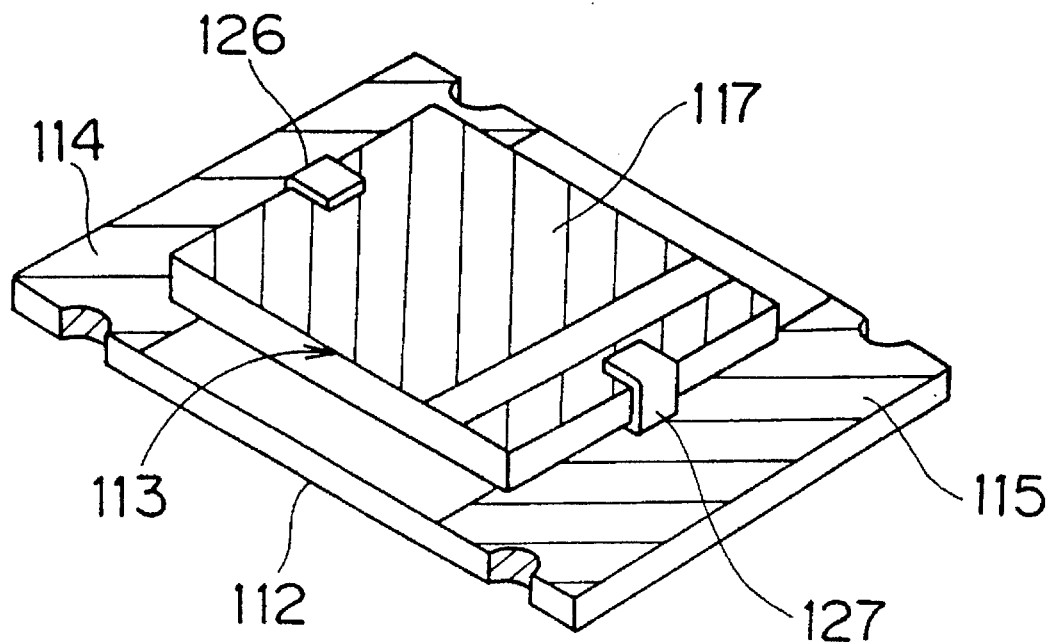
FIG. 29 is a perspective view showing still another modification of a piezo-resonator which is fixed by metal terminals.
Figure 30:
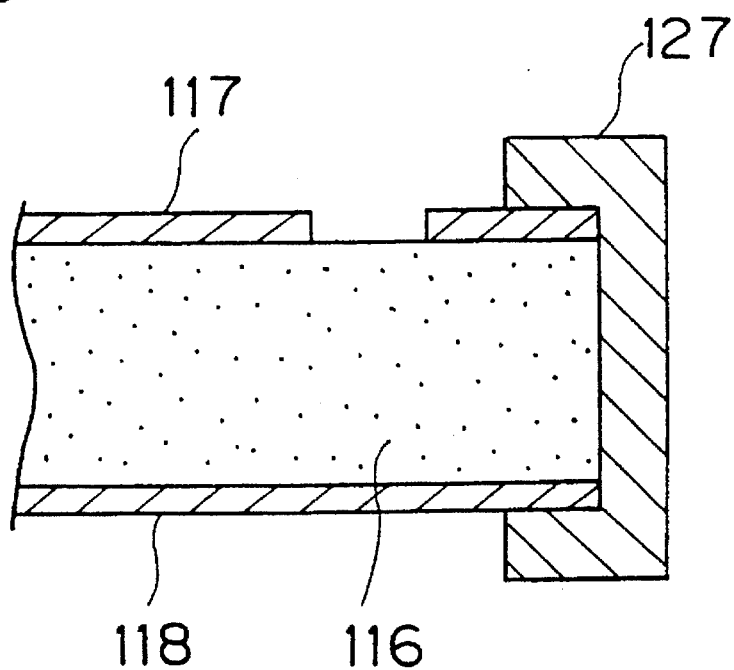
FIG. 30 is a partially fragmented enlarged sectional view for illustrating a metal terminal portion in the modification shown in FIG. 29.

FIG. 29 is a perspective view showing another modification of the piezoelectric resonance component 121. In the structure shown in FIG. 29, metal terminals 126 and 127 are employed. As shown in FIG. 30 in a partially fragmented side sectional view, the metal terminals 126 and 127 are bent to extend from an upper surface toward a lower surface of a piezo-resonator 118, and formed to have such thicknesses that the lower surface of the piezo-resonator 113 is separated from an upper surface of a base substrate 112 through a gap region of a prescribed thickness. Other points of this modification are similar to those of the piezoelectric resonance part 121.

Sixth Embodiment

Figure 32:
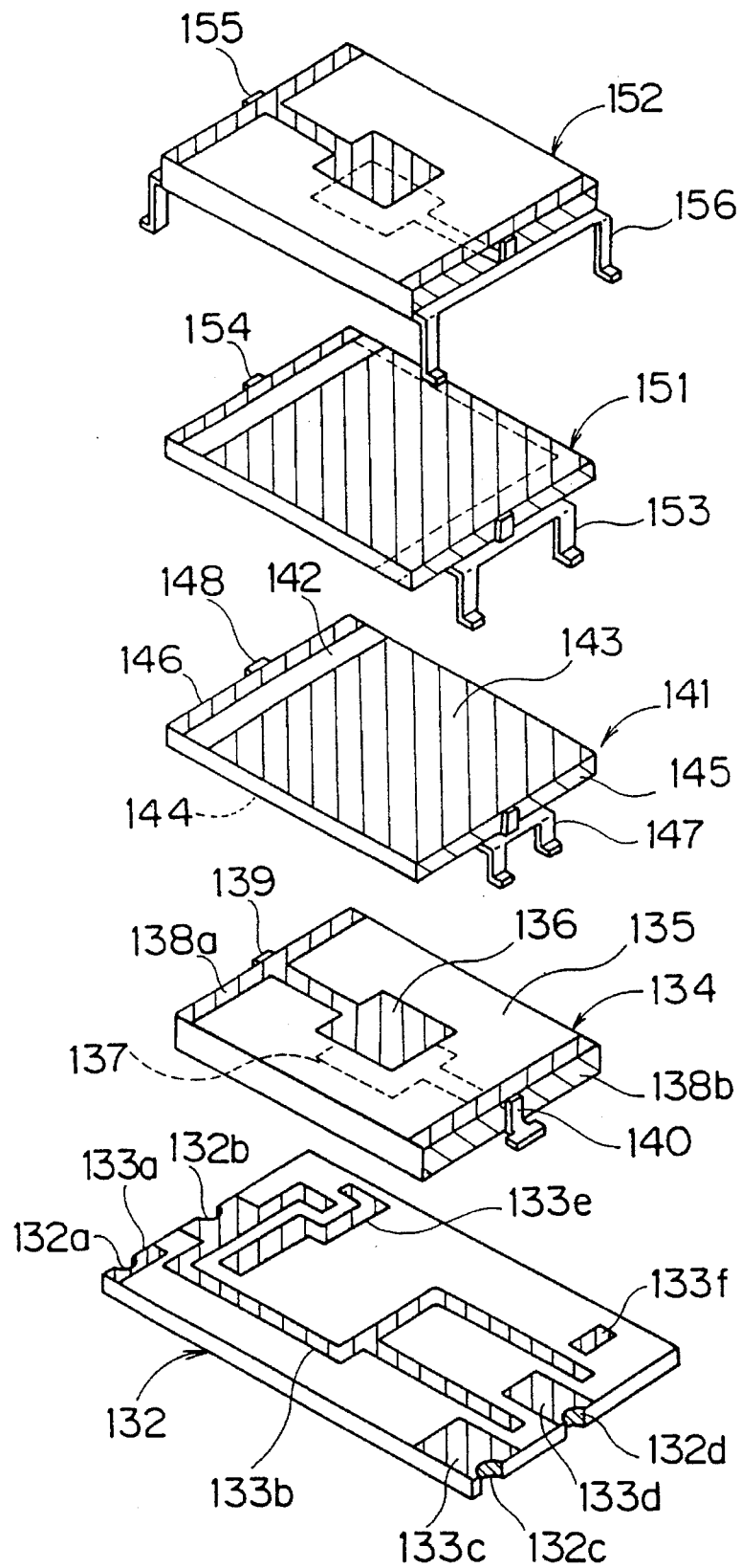
FIG. 32 is an exploded perspective view for illustrating the chip-type piezoelectric resonance component according to the sixth embodiment.

FIG. 32 is an exploded perspective view for illustrating a chip-type piezoelectric resonance component according to a sixth embodiment of the present invention. This embodiment is applied to a ladder-type filter formed by four piezo-resonators, which are fixed to a base substrate through metal terminals similarly to the modifications shown in FIGS. 27 to 30.

In the chip-type piezoelectric resonance component according to this embodiment, terminal electrodes 133a to 133d and connecting electrodes 133e and 133f are formed on a base substrate 132. The terminal electrodes 133a to 133d are formed to reach notches 132a to 132d which are formed in the base substrate 132, thereby improving reliability of connecting portions for mounting the chip-type piezoelectric resonance component on a printed circuit board or the like.

First, a piezo-resonator 134 is fixed onto the base substrate 132.

The piezo-resonator 134 is formed by a rectangular piezo-electric ceramic plate 135. The piezoelectric ceramic plate 135 is uniformly polarized along its thickness, and a first resonance electrode 136 is formed on its center to have a rectangular shape of a relatively small area. On the other hand, another resonance electrode 137 is formed on a lower surface of the piezoelectric ceramic plate 135, to be opposed to the resonance electrode 136. The resonance electrodes 136 and 137 are electrically connected to lead electrodes 138a and 138b which are formed on both shorter side surfaces of the piezoelectric ceramic plate 135 respectively. Metal terminals 139 and 140 are bonded to centers of the lead electrodes 138a and 138b. The metal terminals 139 and 140 are so bent that lower ends thereof extend in the horizontal direction, and bonded to the terminal electrodes 133b and 133d of the base substrate 132 respectively through solder or conductive adhesives.

The metal terminals 139 and 140 can be connected to the lead electrodes 138a and 138b also by conductive adhesives or solder.

Lengths of vertically extending portions of the metal terminals 139 and 140 are so selected that the lower surface of the piezo-resonator 135 is separated from the upper surface of the base substrate 132 through a gap region of a prescribed thickness, similarly to the metal terminals 124 and 125 shown in FIG. 28. Therefore, the piezo-resonator 135 which is fixed to the base substrate 132 by the metal terminals 139 and 140 is not inhibited from vibration.

Another piezo-resonator 141 is stacked on the piezo-resonator 135. This piezo-resonator 141 comprises a rectangular piezoelectric ceramic plate 142 and resonance electrodes 143 and 144 which are formed on upper and lower surfaces thereof. The piezoelectric ceramic plate 142 has a ratio b/a which is set to be capable of exciting width expansion mode vibration, and is uniformly polarized along its thickness. The resonance electrodes 143 and 144 are electrically connected to lead electrodes 145 and 146 which are formed on shorter side surfaces respectively. The lead electrodes 145 and 146 are connected with metal terminals 147 and 148 respectively. In other words, the metal terminals 147 and 148 are bonded to centers of the lead electrodes 145 and 146 by conductive adhesives or solder.

The metal terminals 147 and 148 have forked forward ends, and the metal terminal 147, for example, is electrically connected to the terminal electrode 133b which is provided on the base substrate 132. Further, the metal terminals 147 and 148 slightly outwardly extend from both side surfaces and are then downwardly bent on the lower surface side of the piezoelectric ceramic plate 142. Lengths of vertically extending portions of the metal terminals 147 and 148 are so selected that the lower surface of the piezoelectric ceramic plate 142 is separated from the upper surface of the piezo-resonator 134 through a gap region of a prescribed thickness. In other words, the metal terminals 147 and 148 are formed not to be in contact with the electrode 136 and the metal terminals 139 and 140 of the piezo-resonator 134.

Additional piezo-resonators 151 and 152 are stacked on the piezo-resonator 141. The piezo-resonator 151 is similar in electrode structure to the piezo-resonator 141. Metal terminals 153 and 154 of this piezo-resonator 151 are formed on positions which are not in electrical contact with the electrodes 136 and 143 and the metal terminals 139, 140, 147 and 148 of the piezo-resonators 134 and 141. Further, the metal terminals 153 and 154 are electrically connected to the terminal electrodes 133c and 133b which are provided on the base substrate 132 respectively. On the other hand, the piezo-resonator 152 is formed similarly to the piezo-resonator 135. As to metal terminals 155 and 156 which are bonded to the piezo-resonator 152, the metal terminal 155, for example, is electrically connected to the terminal electrode 133e.

Figure 31:
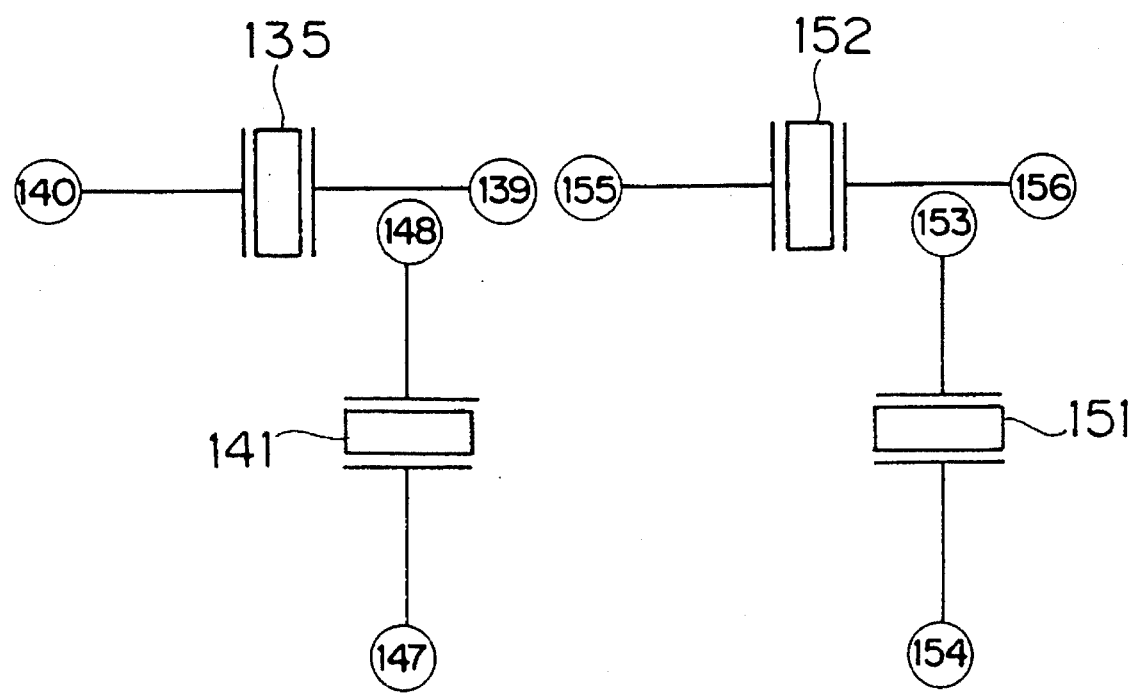
FIG. 31 is a diagram for illustrating the circuit structure of a chip-type piezoelectric resonance component according to a sixth embodiment of the present invention.

In the chip-type piezoelectric resonance component according to the sixth embodiment, the piezo-resonators 134, 141, 151 and 152 are formed in the aforementioned manner, whereby a two-stage ladder-type filter can be formed by electrically connecting the metal terminals 139, 140, 147, 148, 153, 154, 155 and 156 of the respective piezo-resonators 134, 141, 151 and 152 with each other on the base substrate 132, as shown in FIG. 31.

While the piezo-resonators 134, 141, 151 and 152 are fixed through the metal terminals 139, 140, 147, 148, 153, 154, 155 and 156 in the sixth embodiment as described above, these piezo-resonators 134, 141, 151 and 152 may alternatively be stacked on the base substrate 132 through conductive adhesives, similarly to the aforementioned first to fifth embodiments.

Figure 1:
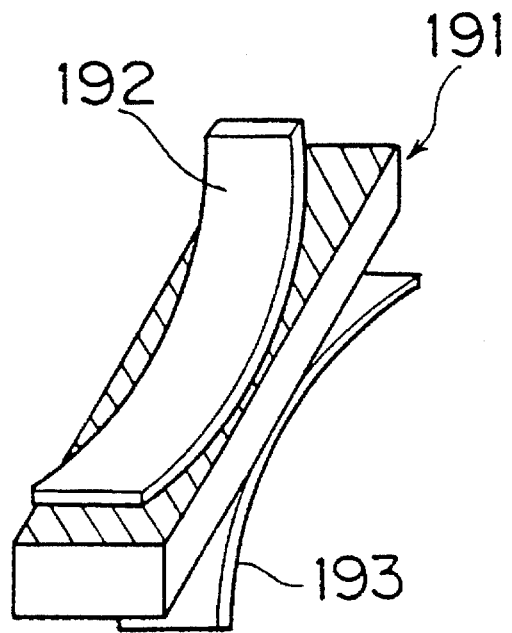
FIG. 1 is a perspective view for illustrating a conventional piezo-resonator which is supported by spring terminals.
Figure 2:
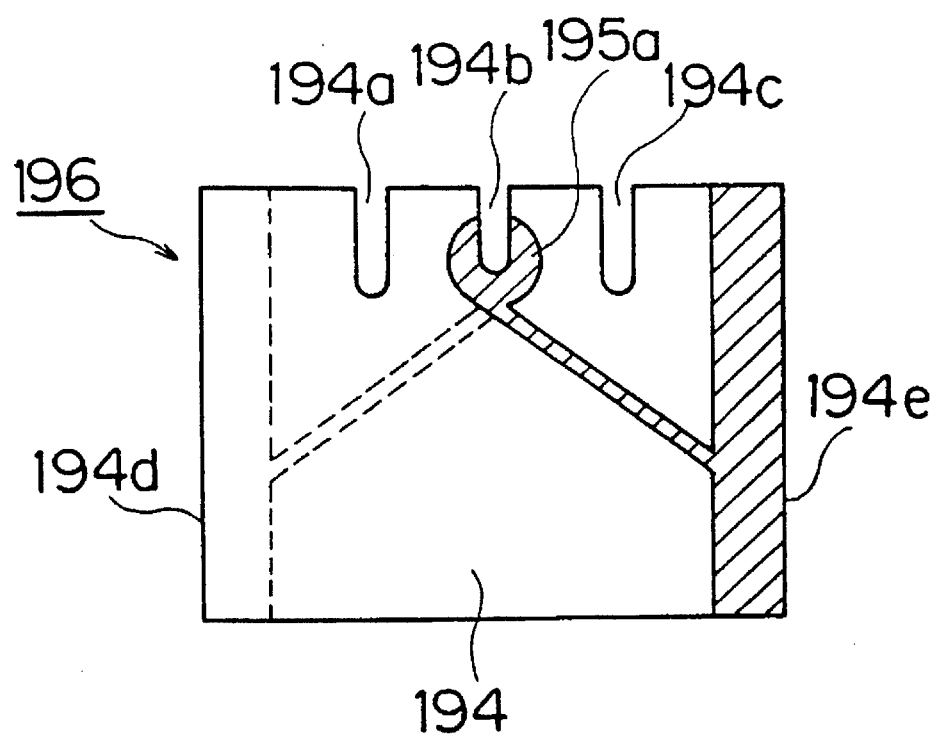
FIG. 2 is a plan view showing a conventional tuning fork type piezo-resonator.

While no cap member is illustrated in relation to the sixth embodiment, a cap member 4 (see FIG. 1) is fixed to the base substrate 132 to enclose the multilayer structure of the piezo-resonators 134, 141, 151 and 152, similarly to the first embodiment.

Seventh Embodiment

Figure 33:
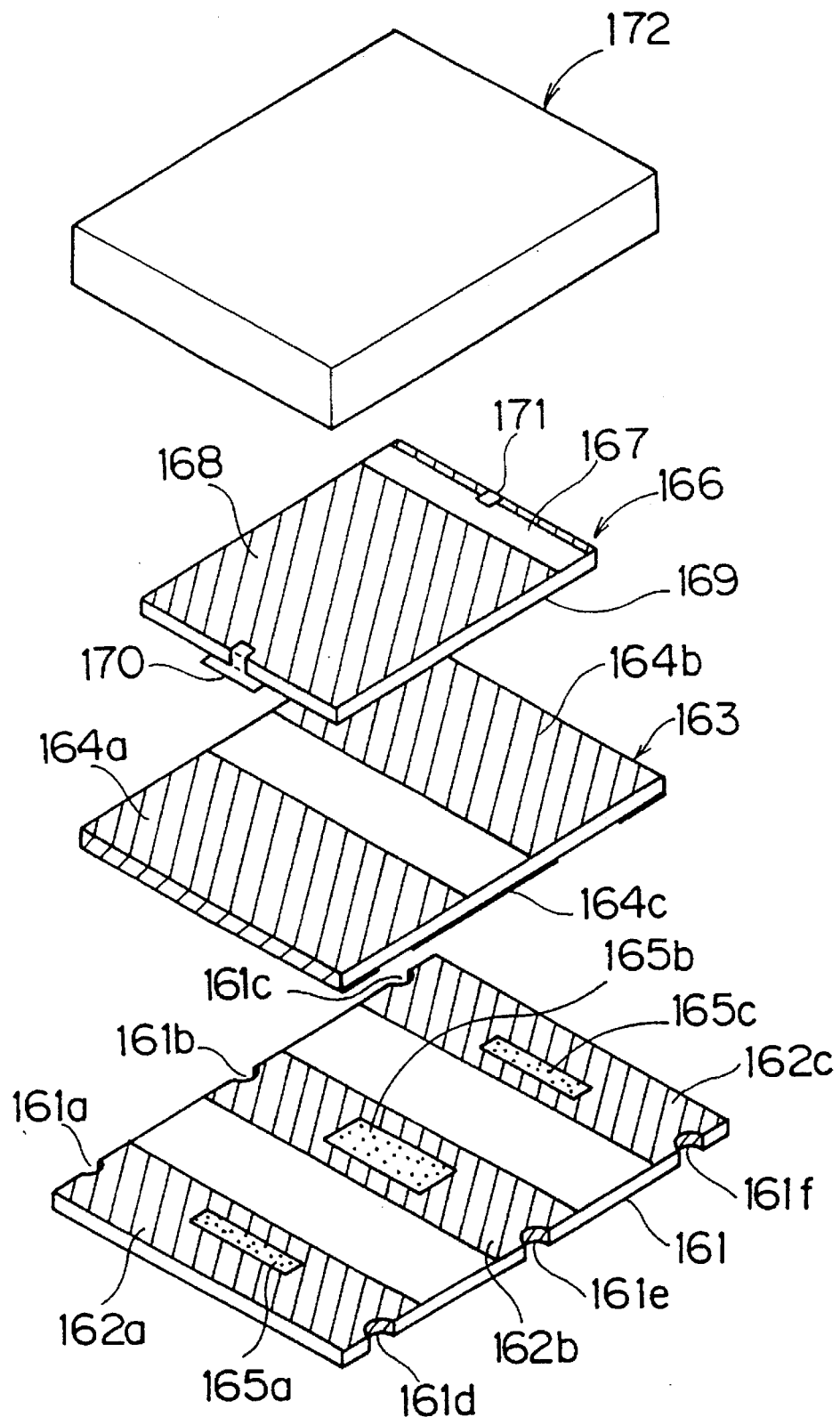
FIG. 33 is an exploded perspective view for illustrating a chip-type piezoelectric resonance component according to a seventh embodiment of the present invention.

FIG. 33 is an exploded perspective view for illustrating a chip-type piezoelectric resonance component according to a seventh embodiment of the present invention. This embodiment is applied to a three-terminal piezo-oscillator having built-in capacitance provided with one energy-trap piezo-resonator utilizing a width expansion mode and two capacitors. According to this embodiment, the piezo-resonator utilizing a width expansion mode is fixed not to a base substrate but to a dielectric substrate for forming the capacitors.

Referring to FIG. 33, terminal electrodes 162a to 162c are formed on a rectangular base substrate 161 which is made of an insulating material. The terminal electrodes 162a and 162c are formed along shorter side edges of the base substrate 161, while the terminal electrode 162b is formed on a central region of the base substrate 161 in parallel with the shorter side edges thereof. Further, notches 161a to 161f are formed in side surfaces of the base substrate 161. The terminal electrode 162a is formed to reach the notches 161a and 161d. Similarly, the terminal electrode 162b is formed to reach inner peripheral surfaces of the notches 161b and 161e, while the terminal electrode 162c is formed to reach inner peripheral surfaces of the notches 161c and 161f. A dielectric substrate 163 for forming the capacitors is fixed onto the base substrate 161. A pair of capacitive electrodes 164a and 164b for extracting electrostatic capacitance are arranged on an upper surface of the dielectric substrate 163 at a prescribe distance. On the other hand, still another capacitive electrode 164c is formed on a central region of a lower surface of the dielectric substrate 163. This capacitive electrode 164c is formed to overlap with the capacitive electrodes 164a and 164b through the dielectric substrate 163. Thus, a first capacitor is formed by the portion where the capacitive electrodes 164a and 164c are opposed to each other, and a second capacitor is formed by the portion where the capacitive electrodes 164b and 164c are opposed to each other.

The capacitive electrodes 164a and 164b are formed to extend from the upper surface of the dielectric substrate 163 to the lower surface through side surfaces. On the lower surface of the dielectric substrate 163, the capacitive electrodes 164a and 164b are arranged at prescribed distances from the capacitive electrode 164c, to be electrically isolated from the same.

The dielectric substrate 163 is smaller in plane shape than the base substrate 161. Conductive adhesives 165a to 165c are applied onto the base substrate 161, in order to fix the dielectric substrate 163. The conductive adhesive 165a is adapted to bond the terminal electrode 162a provided on the base substrate 161 with a portion of the capacitive electrode 164a of the dielectric substrate 163 reaching the lower surface. Similarly, the conductive adhesive 165b is adapted to bond and electrically connect the terminal electrode 162b with the capacitive electrode 164c. Further, the conductive adhesive 165c fixes and electrically connects a portion of the capacitive electrode 164b reaching the lower surface of the dielectric substrate 163 to and with the terminal electrode 162c.

The conductive adhesives 165a to 165c may be replaced by other conductive bonding agents such as solder.

Figure 34:
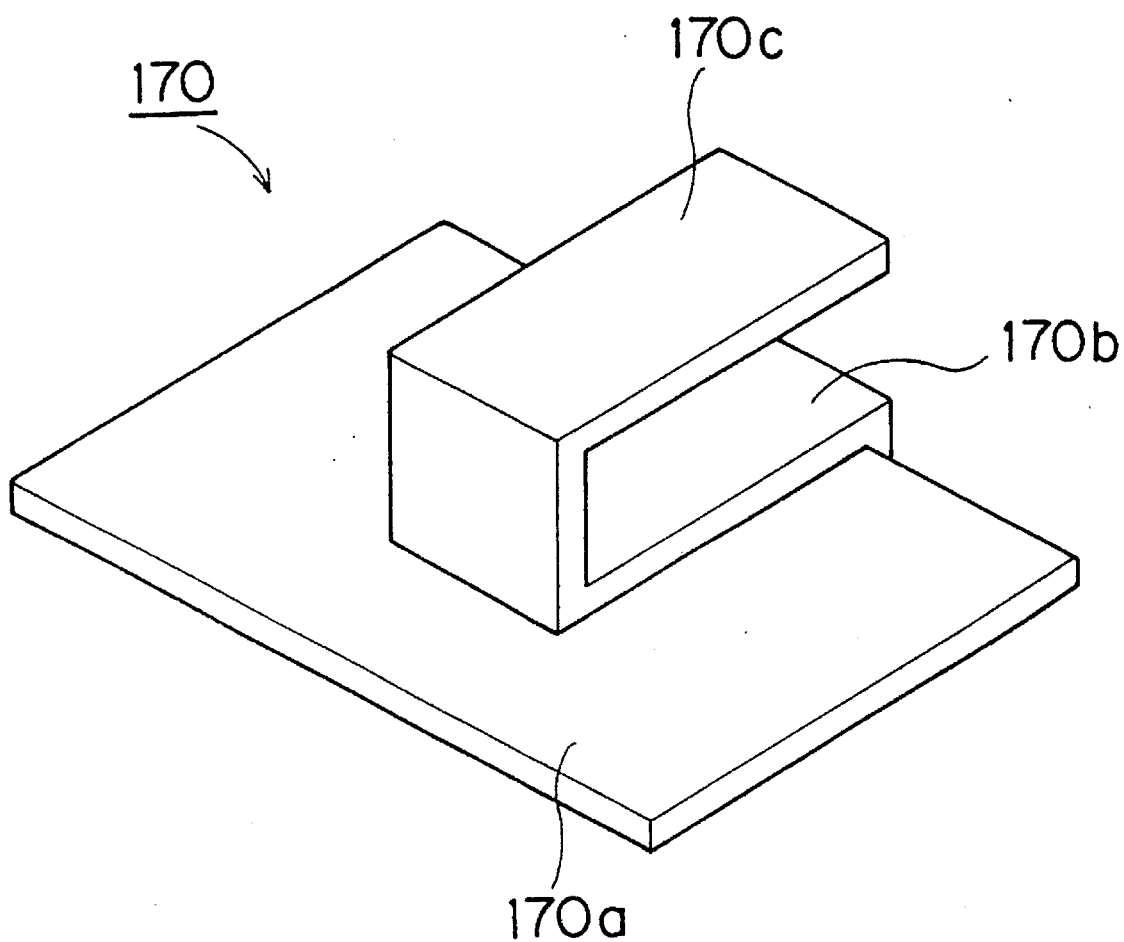
FIG. 34 is an enlarged perspective view for illustrating a metal terminal which is employed in the seventh embodiment.

According to this embodiment, an energy-trap piezo-resonator 166 utilizing a width expansion mode is fixed onto the dielectric substrate 168. The piezo-resonator 166 is formed similarly to the piezo-resonator 112 shown in FIG. 26. Namely, resonance electrodes 168 and 169 are formed on upper and lower surfaces of a rectangular plate type piezoelectric substrate 167 having a shape capable of exciting width expansion mode vibration. The piezo-resonator 166 is fixed onto the dielectric substrate 163 by metal terminals 170 and 171. As shown in FIG. 34 in an enlarged manner, the metal terminal 170 has a rectangular plate type fixing portion 170a. This fixing portion 170a is formed to have a certain degree of area, to be bonded onto the capacitive electrode 164a. A piezo-resonator support portion 170c is provided to extend from a side edge of the fixing portion 170a and to define a U-shaped space 170b as viewed from a side portion. The height of this space 170b is so selected that the piezo-resonator 166 can be received in this space 170b and the metal terminal 170 can be brought into pressure contact with the resonance electrode 168 provided on the piezo-resonator 166. On the other hand, the fixing portion 170a is sized not to be electrically connected with the resonance electrode 169 (FIG. 33) provided on the lower surface of the piezo-resonator 166. The other metal terminal 171 is formed similarly to the metal terminal 170. The piezo-resonator 166 is fixed onto the dielectric substrate 168 through the metal terminals 170 and 171, which are bonded to the capacitive electrodes 164a and 164b by conductive adhesives respectively. Alternatively, the metal terminals 170 and 171 may be soldered to the capacitive electrodes 164a and 164b respectively.

According to this embodiment, the dielectric substrate 163 and the piezo-resonator 166 are stacked on and fixed to the base substrate 161, and thereafter a cap member 172 is mounted on and fixed to the base substrate 161, similarly to the first to sixth embodiments. The cap member 172 may be made of an insulating material such as synthetic resin, or a conductive material such as a metal. When the cap member 172 is made of a conductive material, this cap member 172 may be fixed to the base substrate 161 through an insulating adhesive, or bonded to only a terminal electrode which is connected to a ground potential, such as the terminal electrode 162b, for example, by a conductive adhesive, to be fixed.

Eighth Embodiment

Figure 35:
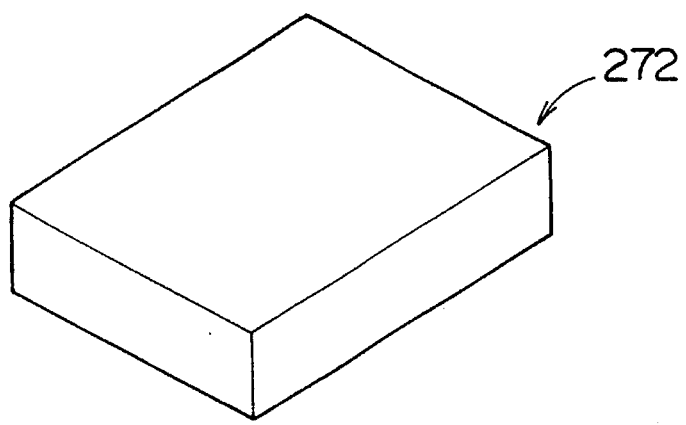
FIG. 35 is an exploded perspective view for illustrating a chip-type piezoelectric resonance component according to an eighth embodiment of the present invention.
Figure 35:
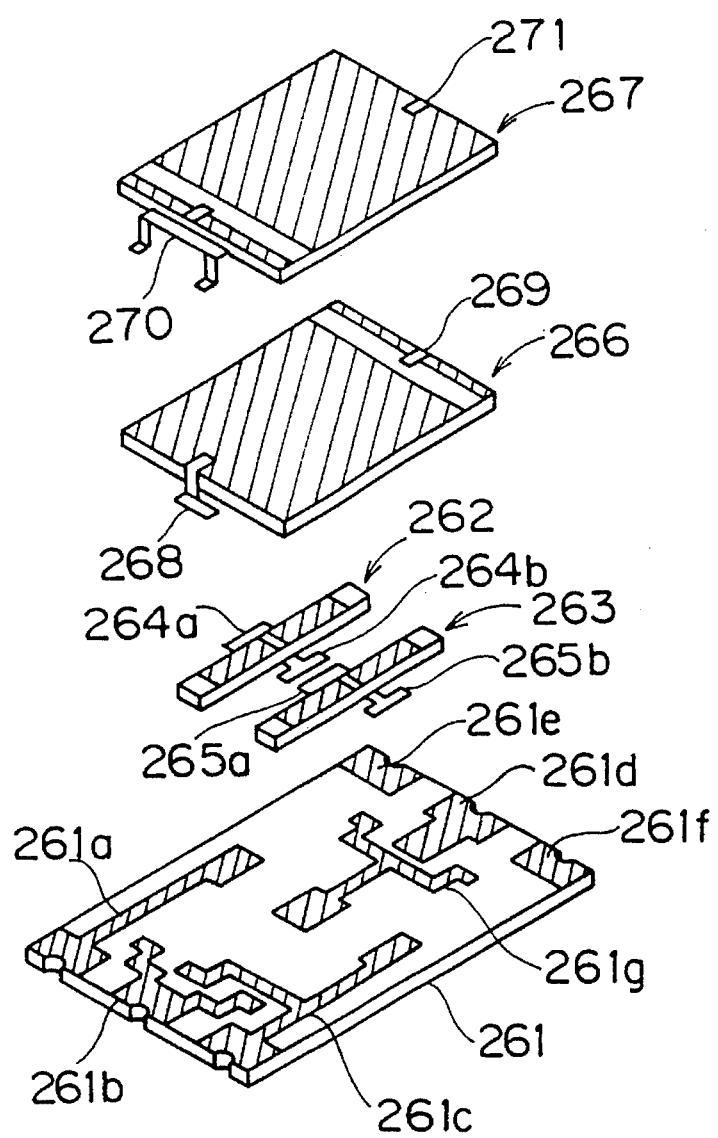

FIG. 35 is an exploded perspective view for illustrating a chip-type piezoelectric resonance component according to an eighth embodiment of the present invention. This embodiment is applied to a ladder-type filter having two energy-trap piezo-resonators utilizing a width expansion mode as parallel resonators and two piezo-resonators utilizing a length mode as series resonators. Also in this embodiment, the piezo-resonators are fixed to a base substrate through metal terminals, similarly to the sixth embodiment.

Terminal electrodes 261a to 261d are formed on a base substrate 261. Further, dummy electrodes 261e and 261f are formed on corner portions of an upper surface of the base substrate 261. In addition, a connecting electrode 261g is formed on the upper surface of the base substrate 261.

Figure 37:
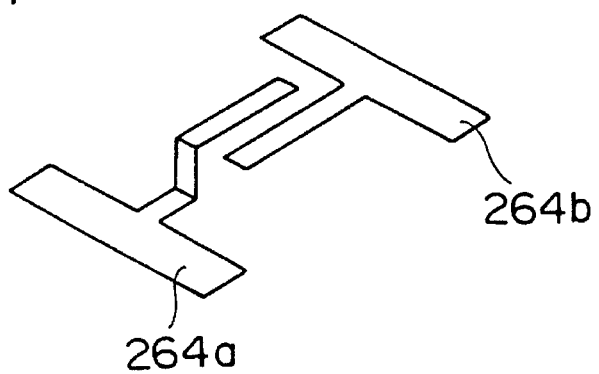
FIG. 37 is a perspective view for illustrating metal terminals which are fixed to a piezo-resonator utilizing a length vibration mode.

Piezo-resonators 262 and 263 utilizing a length mode are fixed onto the base substrate 261 through metal terminals 264a, 264b, 265a and 265b. FIG. 37 is an enlarged perspective view showing the metal terminals 264a and 264b.

Each of the piezo-resonators 262 and 263 utilizing a length mode comprises a long rectangular piezoelectric plate and resonance electrodes which are provided on both major surfaces thereof, and contracts/expands when an alternating voltage is applied across the resonance electrodes provided on the major surfaces, as well known in the art. Further, the piezo-resonators 262 and 263 utilizing a length mode have vibration nodal points in central portions thereof. Therefore, the metal terminals 264a to 265b are bonded to the resonance electrodes at longitudinal central portions of the piezo-resonators 262 and 263 through solder or conductive adhesives.

The metal terminal 264a is bonded to the terminal electrode 261a which is provided on the base substrate 261 by solder or a conductive adhesive. The metal terminal 264b is bonded to the connecting electrode 261d by solder or a conductive adhesive. The metal terminal 265a is also bonded to the connecting electrode 261d by solder or a conductive adhesive. Further, the metal terminal 265b is bonded to the terminal electrode 261c by solder or a conductive adhesive.

As hereinabove described, the metal terminals 264a to 265b are bonded to the terminal electrodes 261a and 261c and the connecting electrode 261d provided on the base substrate 261 by solder or conductive adhesives, whereby the piezo-resonators 262 and 263 are fixed to the base substrate 261 and electrically connected with the electrodes 261a to 261d provided on the base substrate 261.

The metal terminals 264b and 265b are formed by metal plates having prescribed thicknesses. When the piezo-resonators 262 and 263 are fixed to the base substrate 261, therefore, lower surfaces thereof are separated from the upper surface of the base substrate 261 at a prescribed distance. When the piezo-resonators 262 and 263 are fixed through the metal terminals 264a to 265b, therefore, the piezo-resonators 262 and 263 are hardly inhibited from vibration.

On the other hand, piezo-resonators 266 and 267 utilizing a width expansion mode are stacked on the piezo-resonators 262 and 263. The piezo-resonator 266 is fixed to the base substrate 261 by metal terminals 268 and 269, so that its lower surface is separated from upper surfaces of the piezo-resonators 262 and 263 through a space of a prescribed thickness. Lengths of vertically extending portions of the metal terminals 268 and 269 (see FIG. 36B) are selected to define the space of the prescribed thickness between the lower surface of the piezo-resonator 266 and the upper surfaces of the piezo-resonators 262 and 263, thereby allowing vibration.

Also as to the piezo-resonator 267, lengths of vertically extending portions of metal terminals 270 and 271 are so selected that a lower surface of the piezo-resonator 267 is not in contact with the upper surface of the piezo-resonator 266 upon fixation to the base substrate 261.

These piezo-resonators 266 and 267 are similar in structure to the aforementioned piezo-resonator 113 utilizing a width expansion mode shown in FIG. 26.

Figure 36A:
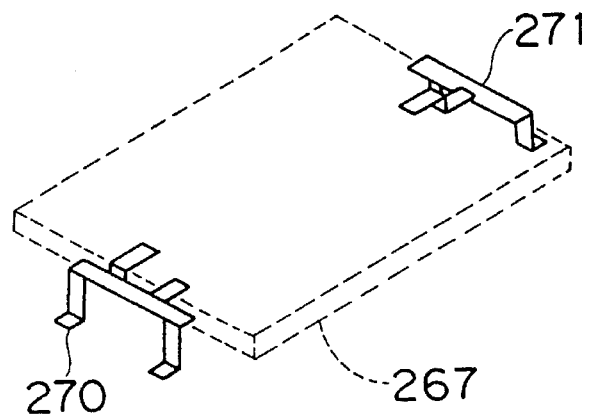
FIGS. 36A and 36B are perspective views for illustrating metal terminals which are employed in the eighth embodiment respectively.
Figure 36B:
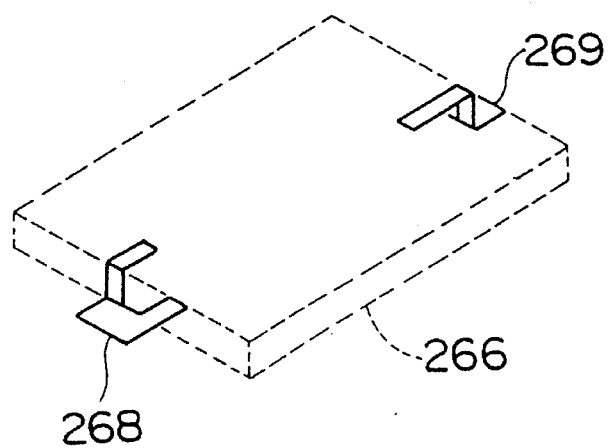

The metal terminals 268 and 269 are formed as shown in FIG. 36B, while the metal terminals 270 and 271 are formed as shown in FIG. 36A.

The metal terminals 268 and 269 are bonded to and connected with the terminal electrodes 261c and 261d respectively. On the other hand, the metal terminals 270 and 271 are bonded to the terminal electrode 261b and the connecting electrode 261g respectively. These metal terminals 268 to 271 are bonded to the terminal electrodes 261b to 261d and the connecting electrode 261g through solder or conductive adhesives. Thus, the piezo-resonators 266 and 267 are fixed to the base substrate 261.

According to this embodiment, a cap member 272 is fixed to the base substrate 261. This cap member 272 is formed similarly to those in the first to sixth embodiments, and bonded to the base substrate 261 also similarly thereto.

Figure 38:
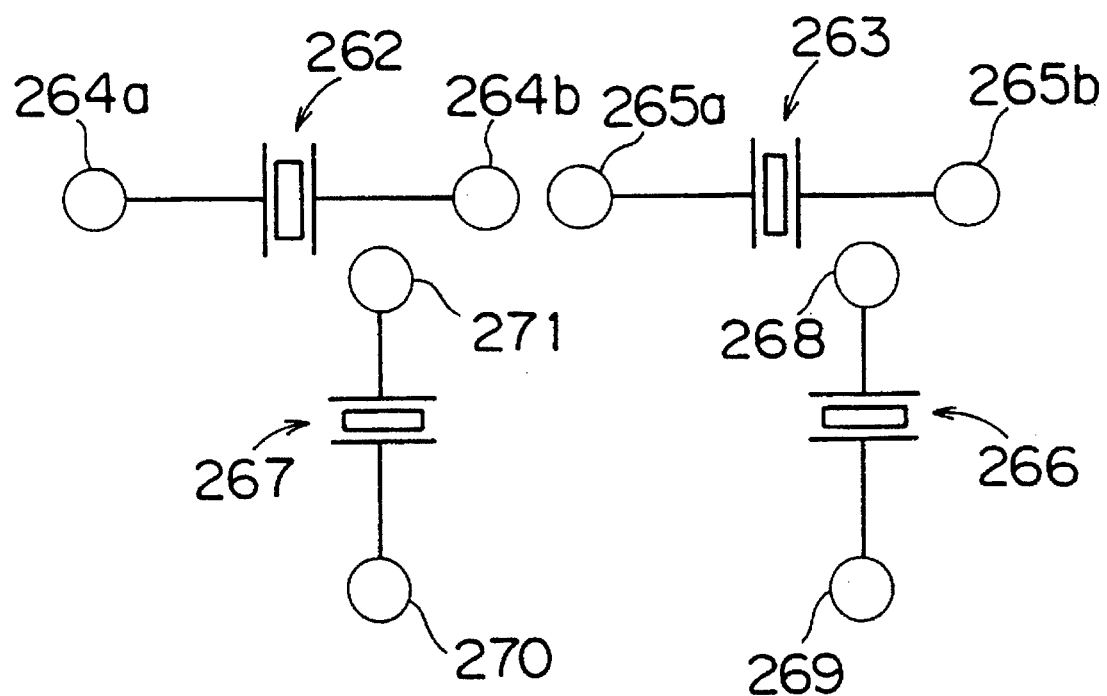
FIG. 38 is a circuit diagram of a ladder-type filter which is formed by the chip-type piezoelectric resonance component according to the eighth embodiment.

According to the eighth embodiment, four piezo-resonators 262, 263, 266 and 267 are electrically connected to the terminal electrodes 261a to 261d and the connecting electrode 261g provided on the base substrate 261 in the aforementioned manner. Thus, this embodiment can be driven as a two-stage ladder-type filter as shown in FIG. 38, due to the arrangement of the four piezo-resonators 262, 263, 266 and 267.

In each of the aforementioned embodiments, the bonding method through the conductive adhesives or solder may be replaced by a welding method such as resistance welding, as the case may be.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A chip-type piezoelectric resonance component comprising:

a base substrate;

a piezo-resonator being directly or indirectly fixed onto said base substrate and provided with a piezoelectric resonance part having a rectangular sectional shape with pairs of shorter and longer sides at a ratio being set in the range of ±10% about a value satisfying the following equation:

$$b/a = n(-1.47\sigma + 1.88) \quad (1)$$

(n: integer)

assuming that a and b represent the lengths of said shorter and longer sides respectively and σ represents the Poisson's ratio of the material forming said piezo-resonator; and a cap member being fixed to said base substrate to enclose said piezo-resonator being fixed onto said base substrate.

2. The chip-type piezoelectric resonance component in accordance with claim 1, wherein said piezo-resonator further comprises a support part being coupled to said piezoelectric resonance part, said piezo-resonator being fixed to said base substrate at said support part.

3. The chip-type piezoelectric resonance component in accordance with claim 1 or 2, further comprising gap forming means for fixing said piezoelectric resonance part to said base substrate through a gap of a prescribed thickness.

4. The chip-type piezoelectric resonance component in accordance with claim 3, wherein said gap forming means is an adhesive for fixing said piezo-resonator to said base substrate.

5. The chip-type piezoelectric resonance component in accordance with claim 3, further comprising a terminal electrode being formed on said base substrate for connection with the exterior, said gap forming means being a metal terminal electrically connecting said piezo-resonator with said terminal electrode.

6. The chip-type piezoelectric resonance component in accordance with claim 4, further comprising a terminal electrode being formed on said base substrate, said adhesive being a conductive adhesive electrically connecting said terminal electrode with said piezo-resonator.

7. The chip-type piezoelectric resonance component in accordance with claim 1, wherein a plurality of said piezo-resonators are stacked with each other not to mutually hinder vibration of said piezoelectric resonance parts thereof.

8. The chip-type piezoelectric resonance component in accordance with claim 7, wherein a filter circuit is formed by said plurality of piezo-resonators.

9. The chip-type piezoelectric resonance component in accordance with claim 1, wherein said piezo-resonator is fixed onto a plate type member being fixed onto said base substrate, said piezo-resonator thereby being indirectly fixed to said base substrate.

10. The chip-type piezoelectric resonance component in accordance with claim 2, wherein a plurality of said piezo-resonators are stacked with each other not to mutually hinder vibration of said piezoelectric resonance parts thereof.

11. The chip-type piezoelectric resonance component in accordance with claim 10, wherein a filter circuit is formed by said plurality of piezo-resonators.

12. The chip-type piezoelectric resonance component in accordance with claim 3, wherein a plurality of said piezo-resonators are stacked with each other not to mutually hinder vibration of said piezoelectric resonance parts thereof.

13. The chip-type piezoelectric resonance component in accordance with claim 12, wherein a filter circuit is formed by said plurality of piezo-resonators.

14. The chip-type piezoelectric resonance component in accordance with claim 4, wherein a plurality of said piezo-resonators are stacked with each other not to mutually hinder vibration of said piezoelectric resonance parts thereof.

15. The chip-type piezoelectric resonance component in accordance with claim 14, wherein a filter circuit is formed by said plurality of piezo-resonators.

16. The chip-type piezoelectric resonance component in accordance with claim 5, wherein a plurality of said piezo-resonators are stacked with each other not to mutually hinder vibration of said piezoelectric resonance parts thereof.

17. The chip-type piezoelectric resonance component in accordance with claim 16, wherein a filter circuit is formed by said plurality of piezo-resonators.

18. The chip-type piezoelectric resonance component in accordance with claim 6, wherein a plurality of said piezo-resonators are stacked with each other not to mutually hinder vibration of said piezoelectric resonance parts thereof.

19. The chip-type piezoelectric resonance component in accordance with claim 18, wherein a filter circuit is formed by said plurality of piezo-resonators.

* * * * *